United States Patent
Liu et al.

(10) Patent No.: US 11,239,178 B2
(45) Date of Patent: Feb. 1, 2022

(54) SEMICONDUCTOR PACKAGE STRUCTURES AND METHODS OF MANUFACTURING THE SAME

(71) Applicant: Advanced Semiconductor Engineering, Inc., Kaohsiung (TW)

(72) Inventors: Chanyuan Liu, Kaohsiung (TW); Han-Chee Yen, Kaohsiung (TW); Kuo-Hsien Liao, Kaohsiung (TW); Alex Chi-Hong Chan, Kaohsiung (TW); Christophe Zinck, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/694,847

(22) Filed: Nov. 25, 2019

(65) Prior Publication Data
US 2020/0176394 A1     Jun. 4, 2020

Related U.S. Application Data

(60) Provisional application No. 62/773,170, filed on Nov. 29, 2018.

(51) Int. Cl.
| | | |
|---|---|---|
| *H01L 23/552* | (2006.01) | |
| *H01L 23/00* | (2006.01) | |
| *H01L 23/31* | (2006.01) | |
| *H01L 21/48* | (2006.01) | |
| *H01L 21/56* | (2006.01) | |
| *H01L 23/498* | (2006.01) | |

(52) U.S. Cl.
CPC ........ *H01L 23/552* (2013.01); *H01L 21/4853* (2013.01); *H01L 21/565* (2013.01); *H01L 23/3121* (2013.01); *H01L 23/49838* (2013.01); *H01L 24/16* (2013.01); *H01L 2224/16227* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 9,508,658 B1 * | 11/2016 | Convert | H01L 21/56 |
| 2015/0255402 A1 * | 9/2015 | Hoang | H01L 21/4853 257/659 |
| 2016/0093576 A1 * | 3/2016 | Chiu | H01L 23/16 257/659 |

(Continued)

*Primary Examiner* — Long Pham
(74) *Attorney, Agent, or Firm* — Foley & Lardner LLP

(57) ABSTRACT

A semiconductor package structure includes a substrate structure having a first surface and a second surface opposite to the first surface; at least two electronic components electrically connected to the first surface of the substrate structure; at least one shielding pad disposed on the first surface of the substrate structure; a plurality of vias connected to the at least one shielding pad; a plurality of shielding wirebonds disposed between the electronic components. Each of the shielding wirebonds includes a first bond and a second bond opposite to the first bond, the first bond and the second bond being electrically connected to the at least one shielding pad, and the vias being free from overlapping with any of the plurality of vias.

19 Claims, 25 Drawing Sheets

(56) References Cited

U.S. PATENT DOCUMENTS

| | | | |
|---|---|---|---|
| 2016/0172309 A1* | 6/2016 | Gong | H01L 23/552 |
| | | | 257/659 |
| 2016/0181206 A1* | 6/2016 | Read | H01L 24/32 |
| | | | 343/873 |
| 2017/0117229 A1* | 4/2017 | Kumbhat | H01L 23/3121 |
| 2017/0117230 A1* | 4/2017 | Kumbhat | H01L 25/16 |
| 2017/0118877 A1* | 4/2017 | Kumbhat | H01L 24/97 |
| 2020/0251422 A1* | 8/2020 | Lee | H01L 23/552 |
| 2020/0365476 A1* | 11/2020 | Otsubo | H01L 23/142 |

* cited by examiner

SEMICONDUCTOR PACKAGE STRUCTURES AND METHODS OF MANUFACTURING THE SAME

CROSS-REFERENCE TO RELATED APPLICATIONS

This application claims the benefit of and priority to U.S. Provisional Application No. 62/773,170 filed Nov. 29, 2018, the contents of which are incorporated herein by reference in their entirety.

BACKGROUND

Field of the Disclosure

The present disclosure relates to, amongst other things, semiconductor package structures and methods of manufacturing the same.

Description of Related Art

A semiconductor package structure may include a plurality of electronic components; however, interference between the electronic components may adversely affect the performance of the semiconductor package structure. Forming a shielding structure on a conductive pad may be performed to provide shielding effectiveness for the adjacent electronic components, which could increase the spacing of the semiconductor package structure. Furthermore, the conductive pad may include a via which is lower than the surface of the conductive pad. Disposing the shielding structure above the via could deteriorate the accuracy of soldering the shielding structure onto the conductive pad.

SUMMARY

According to some example embodiments of the instant disclosure, a semiconductor package structure includes a substrate structure having a first surface and a second surface opposite the first surface, and includes a plurality of vias; at least two electronic components electrically connected to the first surface of the substrate structure; at least one shielding pad disposed on the first surface of the substrate structure; a plurality of compartment shielding wirebonds disposed between the electronic components. Each of the compartment shielding wirebonds includes a first bond and a second bond opposite to the first bond; the first bond and the second bond are electrically connected to the at least one shielding pad, and the vias are interposed between the first bond and the second bond.

According to some example embodiments of the instant disclosure, a semiconductor package structure includes a substrate structure having a first surface and a second surface opposite the first surface, and includes a plurality of vias; a plurality of electronic components electrically connected to the first surface of the substrate structure; a first shielding pad; a second shielding pad separated apart from the first shielding pad; a plurality of compartment shielding wirebonds traversing the electronic components. Each of the compartment shielding wirebonds includes a first bond and a second bond opposite to the first bond; the first bond is electrically connected to the first shielding pad, and the second bond is electrically connected to the second shielding pad.

According to some example embodiments of the instant disclosure, a semiconductor manufacturing process includes providing a substrate structure comprising a plurality of vias; disposing at least two electronic components on the substrate structure; disposing at least one shielding pad on the substrate structure; and mounting a plurality of compartment shielding wirebonds between the electronic components. Each of the compartment shielding wirebonds includes a first bond and a second bond opposite the first bond; the first bond and the second bond are electrically connected to the at least one shielding pad, and the vias are interposed between the first bond and the second bond.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
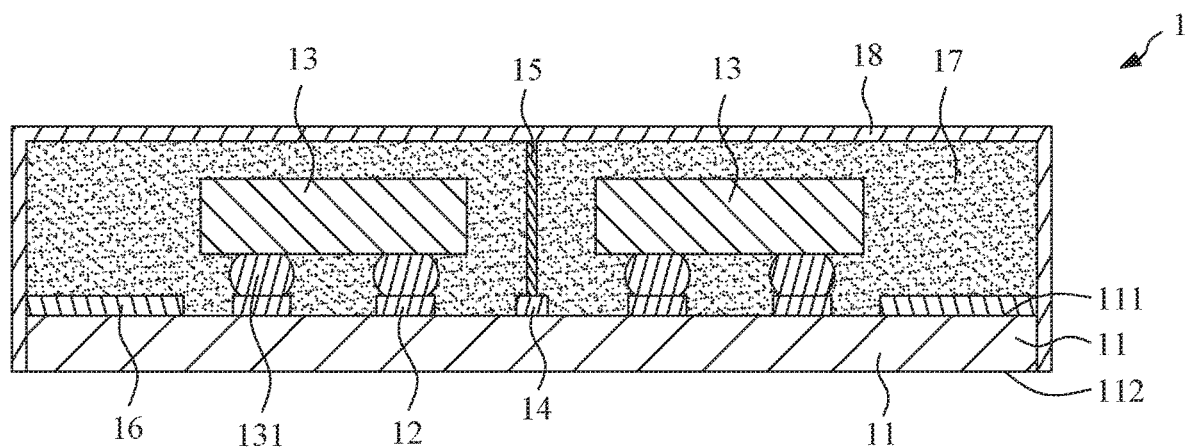
FIG. 1 is a cross-sectional view of a semiconductor package structure in accordance with some embodiments of the subject application.

The following disclosure provides many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 2:
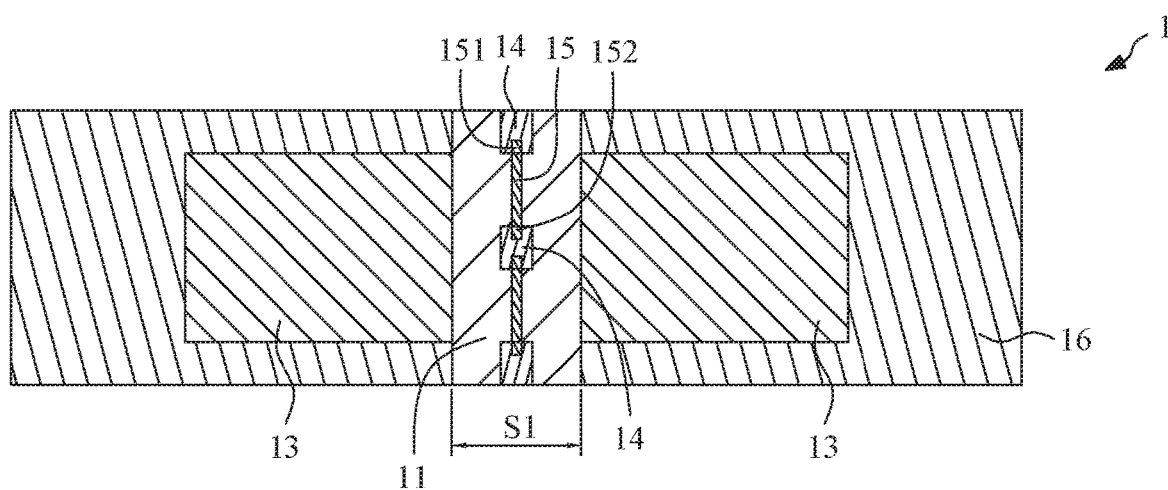
FIG. 2 is a top view of a semiconductor package structure in accordance with some embodiments of the subject application.

FIG. 1 shows a cross-sectional view of a semiconductor package structure 1 in accordance with some embodiments of the subject application. FIG. 2 shows a top view of the semiconductor package structure 1 of FIG. 1 without encapsulant 17 and metal layer 18. The semiconductor package structure 1 may include a substrate structure 11, a plurality of signal pads 12, a plurality of electronic components 13, a plurality of shielding pads 14, a plurality of compartment shielding wirebonds 15, a protection structure 16, an encapsulant 17 and a metal layer 18.

The signal pads 12 are disposed on the substrate structure 11. The electronic component 13 is disposed on the signal pads 12, and electrically connected to the signal pads 12. The shielding pads 14 are disposed on the substrate structure 11, and between two adjacent electronic components 13. The compartment shielding wirebonds 15 are disposed on the shielding pads 14, and electrically connected to the shielding pads 14. The compartment shielding wirebonds 15 are disposed between two adjacent electronic components 13, and used for providing an internal shielding effect for the adjacent electronic component 13. The protection structure 16 is disposed on the substrate structure 11, and defines at least one opening. The signal pads 12 and the shielding pads 14 are disposed within the opening of the protection structure 16. The encapsulant 17 covers the electronic component 13 and the substrate structure 11, the signal pads 12, the shielding pads 14 and at least a portion of each of the compartment shielding wirebonds 15. The metal layer 18 covers the encapsulant 17, and is used for providing an outside shielding effect for the electronic component 13.

In a comparative example, a metal lid is disposed between two adjacent electronic components, and used for providing shielding effectiveness for the adjacent electronic component. The vertical portion of the metal lid is connected to a metal lid pad between the two adjacent electronic components through a solder. In order to avoid the bridge between the solder and the signal pad, a solder mask layer is specified to surround the metal lid pad. That is, the solder mask layer should define an opening to expose the metal lid pad. Thus, a portion of the solder mask layer and the opening are disposed between two adjacent electronic components. The spacing between two adjacent electronic component in the comparative example may be about 690 To use the metal lid for compartment shielding may occupy more space, and can't meet user specifications.

According to the subject application, by using the compartment shielding wirebonds 15, there is no protection structure (e.g., solder mask layer) between two adjacent electronic components 13, and the spacing S1 between two adjacent electronic components 13 may be about 200 μm to 400 μm. Therefore the package size of the semiconductor package structure 1 can be minimized to meet user specifications.

The substrate structure 11 has a first surface 111 and a second surface 112. The second surface 112 is opposite the first surface 111. In some embodiments, the first surface 111 is a top surface, and the second surface 112 is a bottom surface. The signal pads 12 and the shielding pads 14 are disposed on the first surface 111.

In some embodiments, the signal pads 12 may be exposed in the substrate structure 11. The surfaces of the signal pads 12 may be exposed for electrically connecting to the electronic component 13.

In some embodiments, the electronic component 13 may be chips, chip scale package (CSP) or a passive element. The electronic component 13 include a plurality of conductive elements 131 for electrically connecting to the signal pads 12. The conductive elements 131 may be solder balls.

In some embodiments, each of the compartment shielding wirebonds 15 includes a first bond 151 and a second bond 152. The first bond 151 and the second bond 152 are respectively connected to the adjacent shielding pads 14. That is, the shielding pad 14 is electrically connected to the first bond 151 of the compartment shielding wirebond 15 and the second bond 152 of the adjacent compartment shielding wirebond 15.

In some embodiments, a material of the protection structure 16 may include a solder resistant material, such as, for example, benzocyclobutene (BCB) or polyimide. The protection structure 16 may be a solder mask layer.

In some embodiments, the encapsulant 17 may be a molding compound. The encapsulant 17 covers the electronic component 13, the first surface 111 of the substrate structure 11, the protection structure 16, the signal pads 12, the shielding pads 14 and at least a portion of each of the compartment shielding wirebonds 15. In some embodiments, the metal layer 18 may be a conductive metal, and may be electrically connected to the compartment shielding wirebonds 15.

Figure 3:
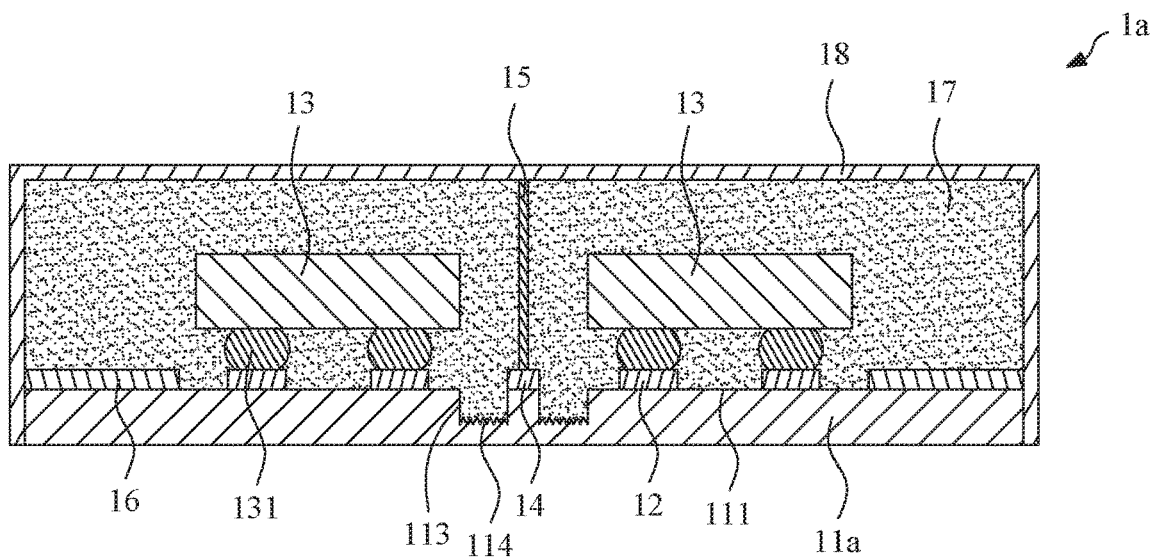
FIG. 3, FIG. 4 and FIG. 5 are cross-sectional views of a semiconductor package structure in accordance with some embodiments of the subject application.

FIG. 3 shows a cross-sectional view of a semiconductor package structure 1a in accordance with some embodiments of the subject application. The semiconductor package structure 1a includes a substrate structure 11a. The substrate structure 11a may define at least one slot 113 around the shielding pads 14. The slot 113 includes a bottom surface 114. A level of the bottom surface 114 is lower than that of the first surface 111. The bottom surface 114 may be a rough surface. In some embodiments, a laser graving process may be used to make the rough surface. The rough surface can provide better adhesion with the encapsulant 17 to overcome the delamination risk for the compartment shielding wirebonds 15 and the shielding pads 14.

Figure 4:
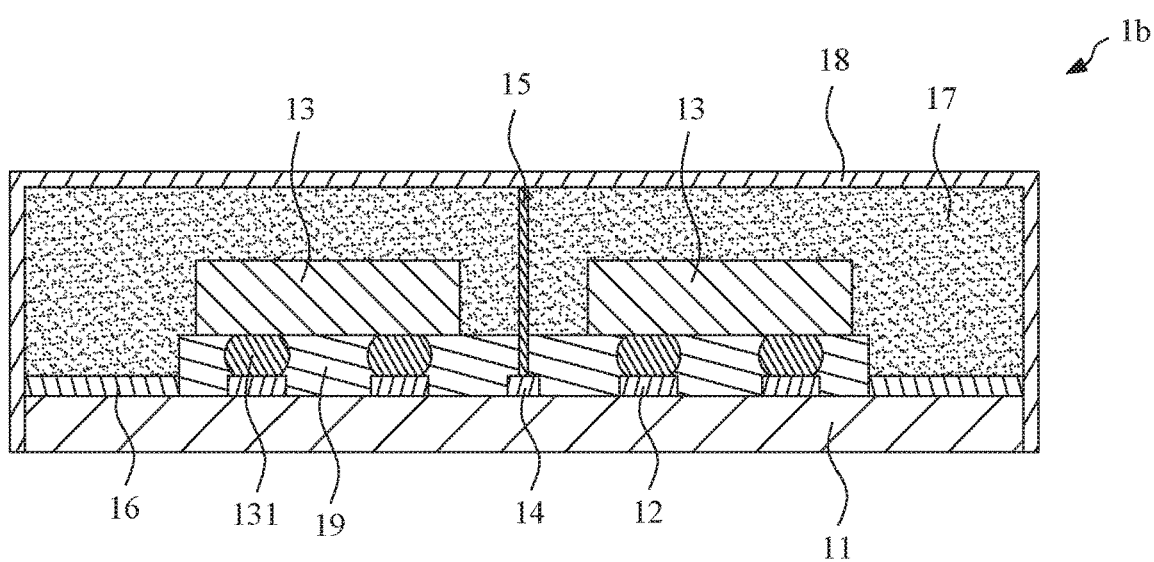

FIG. 4 shows a cross-sectional view of a semiconductor package structure 1b in accordance with some embodiments of the subject application. The semiconductor package structure 1b includes an underfill 19. The underfill 19 covers the signal pads 12, the shielding pads 14, the conductive elements 131 and a portion of the compartment shielding wirebonds 15. The underfill 19 is disposed between the electronic component 13 and the substrate structure 11. The underfill 19 may be epoxy or glue. The underfill 19 can provide better adhesion with the compartment shielding wirebonds 15 and the shielding pads 14 to overcome the delamination risk for the compartment shielding wirebonds 15 and the shielding pads 14.

Figure 5:
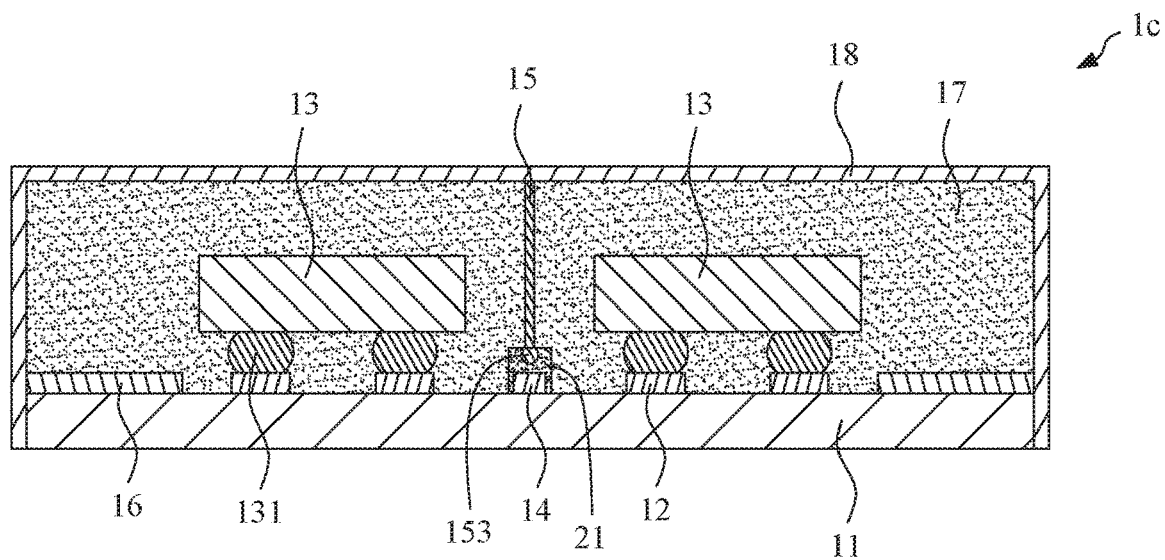

FIG. 5 shows a cross-sectional view of a semiconductor package structure 1c in accordance with some embodiments of the subject application. The semiconductor package structure 1c includes solder 21 covering the shielding pads 14. The compartment shielding wirebonds 15 are mounted in the solder 21. The first bond 151 and second bond 152 of the compartment shielding wirebond 15 has a ball structure 153 embedded in the solder 21 to enhance adhesion between the compartment shielding wirebonds 15 and the shielding pads 14, and to overcome the delamination risk for the compartment shielding wirebonds 15 and the shielding pads 14.

Figure 6:
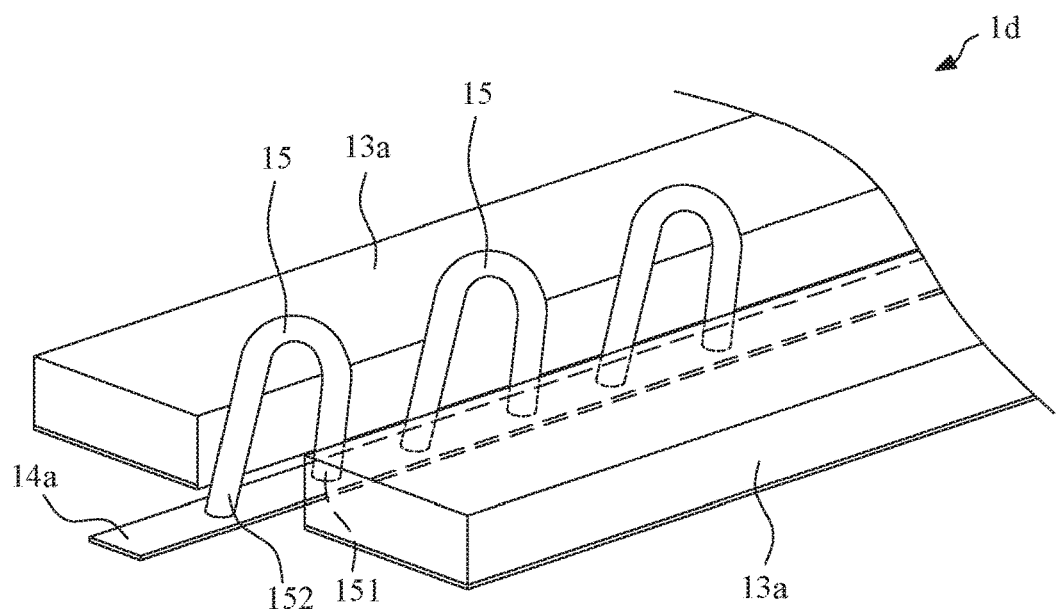
FIG. 6 is a perspective view of a shielding pad and compartment shielding wirebonds structure of a semiconductor package structure in accordance with some embodiments of the subject application.
Figure 7A:
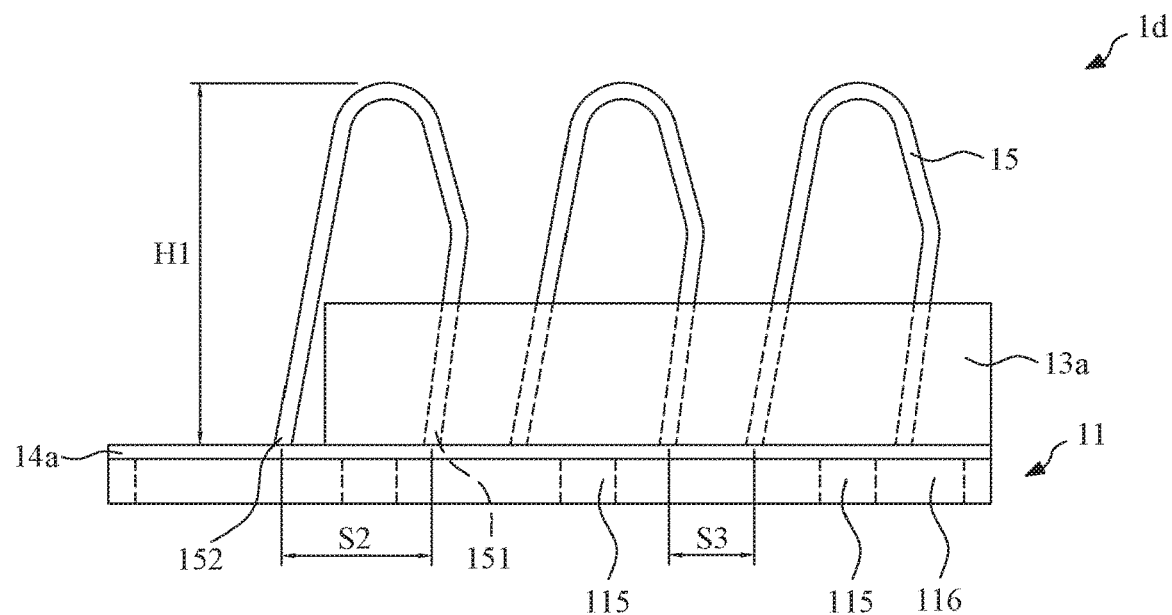
FIG. 7A and FIG. 7B are cross-sectional views of a compartment shielding wirebond structure of a semiconductor package structure in accordance with some embodiments of the subject application.
Figure 7B:
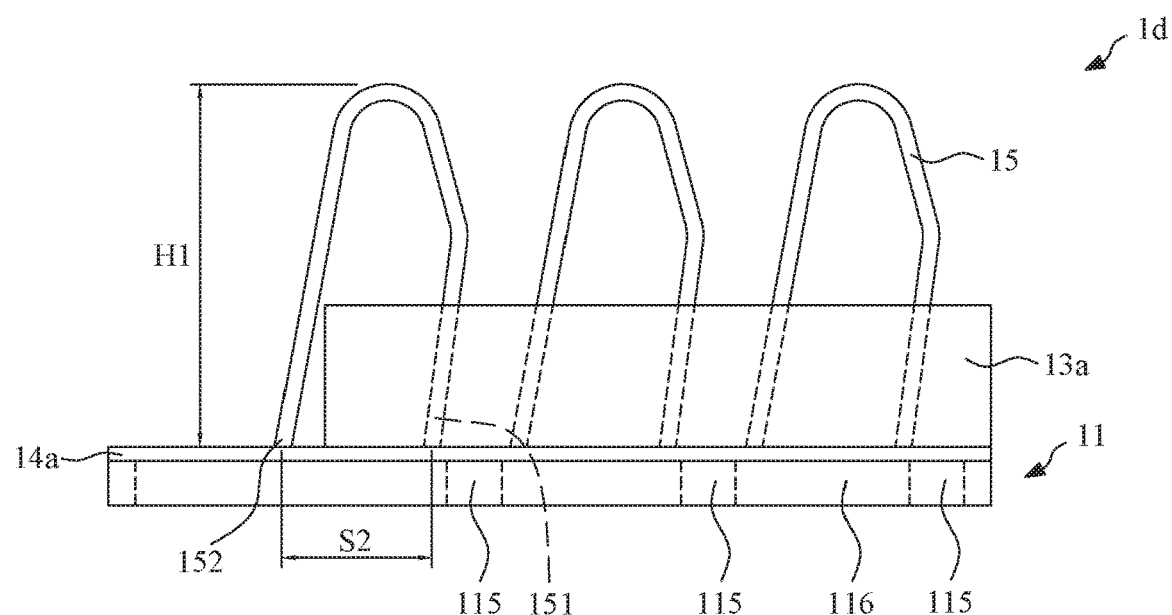
Figure 8:
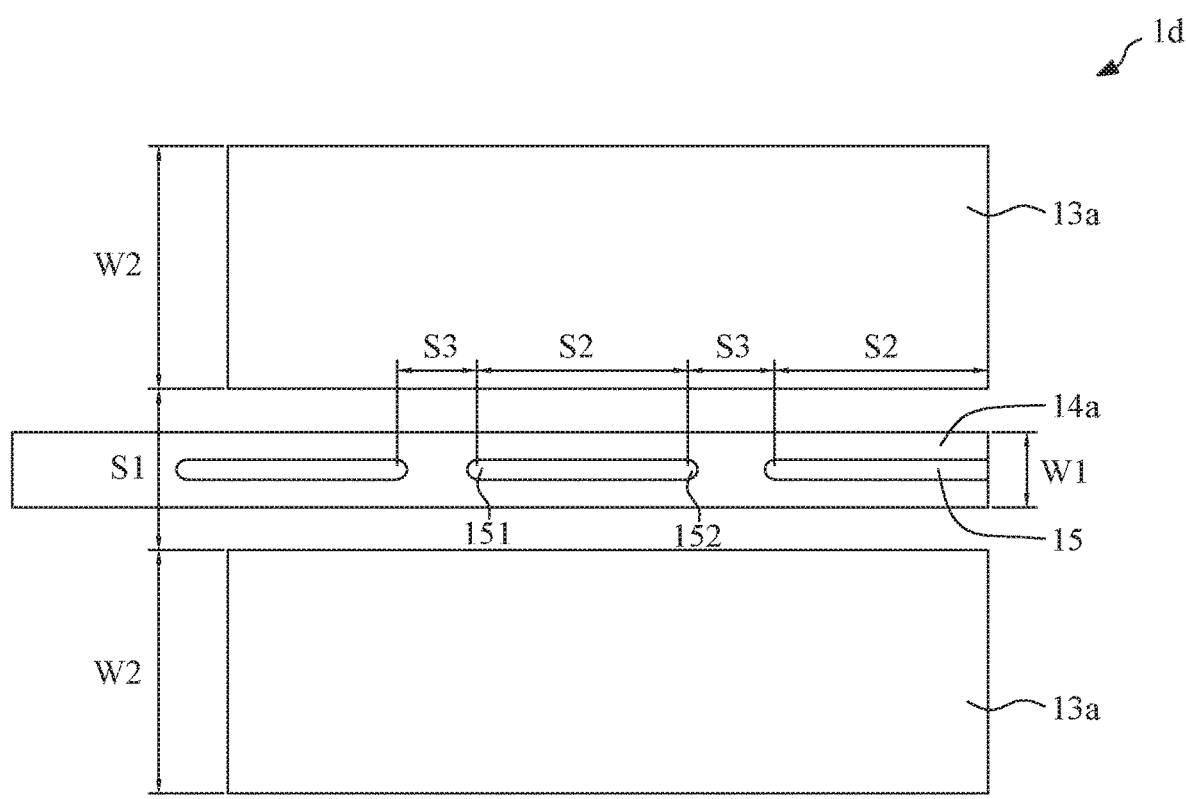
FIG. 8 is a top view of a semiconductor package structure in accordance with some embodiments of the subject application.
Figure 9:
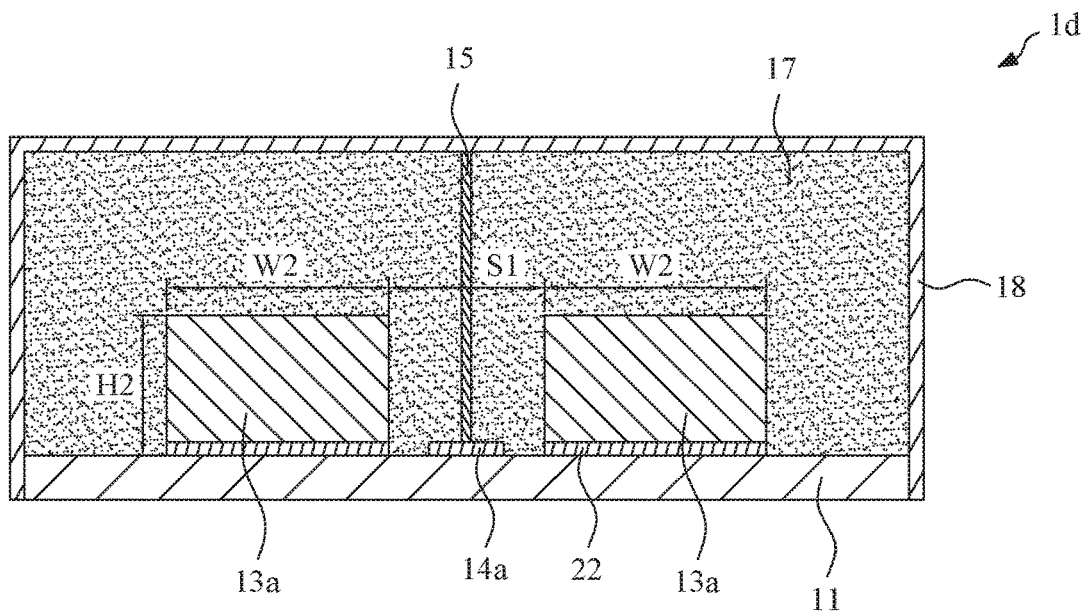
FIG. 9 and FIG. 10 are cross-sectional views of a semiconductor package structure in accordance with some embodiments of the subject application.

FIG. 6 shows a perspective view showing the electronic component 13a, the shielding pad 14a and the compartment shielding wirebonds 15 of a semiconductor package structure 1d in accordance with some embodiments of the subject application. FIG. 7A and FIG. 7B show a side view of the electronic component 13a, the shielding pad 14a and the compartment shielding wirebonds 15 of a semiconductor package structure 1d in accordance with some embodiments of the subject application. FIG. 8 shows a top view showing the electronic component 13a, the shielding pad 14a and the compartment shielding wirebonds 15 of a semiconductor package structure 1d in accordance with some embodiments of the subject application. FIG. 9 shows a cross-sectional view of a semiconductor package structure 1d in accordance with some embodiments of the subject application.

The semiconductor package structure 1d may include one shielding pad 14a. All the compartment shielding wirebonds 15 are mounted on the shielding pad 14a, and are electrically connected to the shielding pad 14a. The shielding pad 14a is a long pad, and a length of the shielding pad 14a may be greater than a length of the semiconductor die 13a from a top view. In some embodiments, the electronic component 13 may be electrically connected to the substrate structure 11 by flip chip bonding, and the conductive elements of the electronic component 13 may be covered by underfill or adhesive 22.

The substrate structure 11 may include a plurality of vias 115 and at least one dielectric structure 116. In some embodiments, the dielectric structure 116 may include a semiconductor substrate composed of, for example, a monocrystalline silicon, a polycrystalline silicon, an amorphous silicon, other suitable materials, or a combination thereof. In some embodiments, the dielectric structure 116 may be, or may include a wiring substrate, for example, a sheet made from pre-impregnated composite fibers. For example, the dielectric structure 116 may include a cured fiber reinforced resin. It is noted that the dielectric structure 116 may include, or be formed from, a cured PID material such as epoxy or polyimide (PI) including photoinitiators. The vias 115 may be embedded in the dielectric structure 116. The vias 115 may be electrically connected to the electronic component 13a and the shielding pad 14a.

In some embodiments, the vias 115 are interposed between the first bond 151 and the second bond 152 of a single compartment shielding wirebond 15. The first bond 151 is the end of the bonding wire firstly engaged with the shielding pad 14a, whereas the second bond 152 is the end of the bonding wire subsequently engaged with the shielding pad 14 during a wire bonding operation. In some embodiments, the first bond 151 can be a ball bond, and the second bond 152 can be a wedge bond. From a top view of the semiconductor package structure 1d, neither the first bond 151 nor the second bond 152 is disposed over any of the vias 115. Alternatively stated, the vias 115, the first bond 151 and the second bond 152 could be arranged in a staggered manner. The vias 115 could interlace with both of the first bond 151 and the second bond 152.

As shown in FIG. 7A, the vias 115 could be formed under a projection of a compartment shielding wirebond 15 but disposed in a staggered arrangement with respect to the first bond 151 and the second bond 152. The vias 115 could be arranged between the first bond 151 and the second bond 152 of a compartment shielding wirebond 15. The first bond 151 and the second bond 152 are not in direct contact with the vias 115. The first bond 151 and the second bond 152 are not formed directly on the vias 115. In some embodiments, compared to a top surface of the shielding pad 14a, a recess or dimple (not illustrated) can be observed on a top surface of the via 115 due to conformal deposition of conductive materials. Such recess or dimple may increase the difficulty to register the location of the first bond or the second bond due to the horizontal level variation. The accuracy and reliability of compartment shielding wirebond 15 on the shielding pad 14a can be enhanced, for example, when the first bond 151 and the second bond 152 are disposed in a staggered arrangement from the vias 115, that is, the first bond 151 and the second bond 152 are registered on the top surface of the shielding pad 14a instead of on the top surface of the vias 115. In some embodiments, the shielding pad 14a receiving the first bond 151 and the second bond 152 of the compartment shielding wirebonds 15 is not covered by any protection layer (e.g., solder mask or solder resist). Therefore, the manufacturing process could be simplified and the wire bond spacing, or the package size, could be reduced.

In other embodiments, as shown in FIG. 7B, the vias 115 could be formed between two adjacent compartment shielding wirebonds 15. The vias 115 could be arranged between the first bond 151 of a compartment shielding wirebond 15 and the second bond 152 of the adjacent compartment shielding wirebond 15. The first bond 151 and the second bond 152 are not in direct contact with the vias 115. The vias 115 are interposed between the first bond 151 and the second bond 152.

The vias 115 arranged in FIG. 7A may be applied to a scheme where the area density of the vias 115 is high. For example, the vias 115 of FIG. 7A can be a portion of a passive component such as an inductor with conductive spiral pattern. On the other hand, the vias 115 arranged in FIG. 7B may be applied to a scheme where the area density of the vias 115 is lower than that shown in FIG. 7A.

Figure 7C:
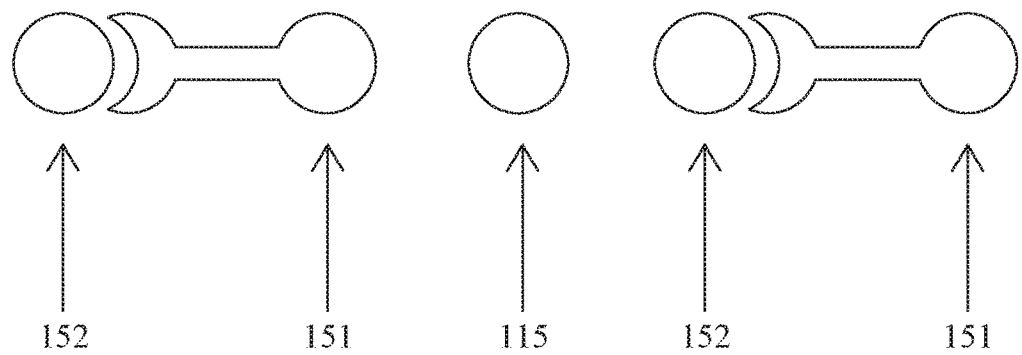
FIG. 7C is a top view of a compartment shielding wirebond structure of a semiconductor package structure in accordance with some embodiments of the subject application.

FIG. 7C shows a top view of the compartment shielding wirebonds 15 illustrated in FIG. 7B. As previously described, the first bond 151 is the end of the bonding wire firstly engaged with the shielding pad 14, whereas the second bond 152 is the end of the bonding wire subsequently engaged with the shielding pad 14 during a wire bonding operation. In some embodiments, the first bond 151 can be a ball bond, and the second bond 152 can be a wedge bond. From a top view perspective, a bond tail feature can be observed at the second bond 152. Cross referencing FIG. 7B and FIG. 7C, a first bond 151 is immediately registered to the left of the via 115, and a second bond 152 is registered immediately to the right of the via 115. None of the first bond 151 and the second bond 152 is disposed on the via 115.

In some embodiments, the wire spacing S2 between the first bond 151 and the second bond 152 of the compartment shielding wirebond 15 may be about 250 µm, and the wire gap S3 between the two adjacent compartment shielding wirebonds 15 may be about 100 µm. The height H1 of the compartment shielding wirebond 15 may be about 430 and the height H3 of the encapsulant 17 may be about 430 µm. That is, the metal layer 18 may contact and be electrically connected to the compartment shielding wirebonds 15. The width W1 of the shielding pad 14a may be about 100 µm. The height H2 of the electronic component 13 may be about 200 µm. The gap S1 between the two adjacent electronic component 13 may be about 200 µm.

Figure 10:
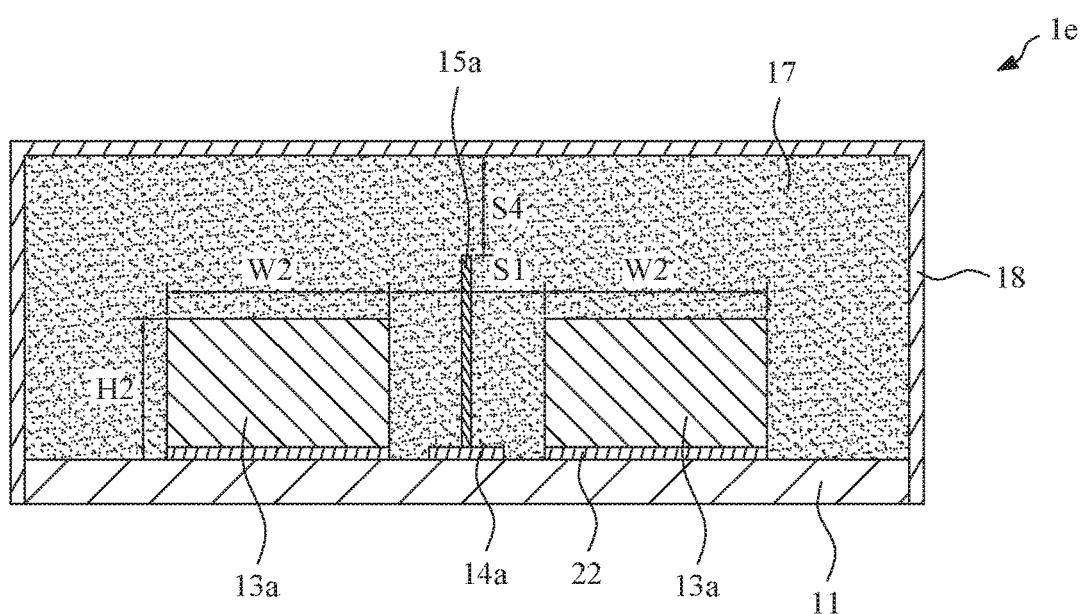

FIG. 10 shows a cross-sectional view of a semiconductor package structure 1e in accordance with some embodiments of the subject application. There is a molding gap S4 between top portions of the compartment shielding wirebonds 15 and the metal layer 18. That is, the metal layer 18 does not contact the compartment shielding wirebonds 15.

The molding gap may be about 50 µm to 350 µm. The height H3 of the encapsulant 17 may be about 430 µm, and the height H2 of the electronic component 13 may be about 200 µm. When the molding gap S4 is larger than about 230 µm, the height H1 of the compartment shielding wirebonds 15 is lower than that of the electronic component 13a.

Figure 11:
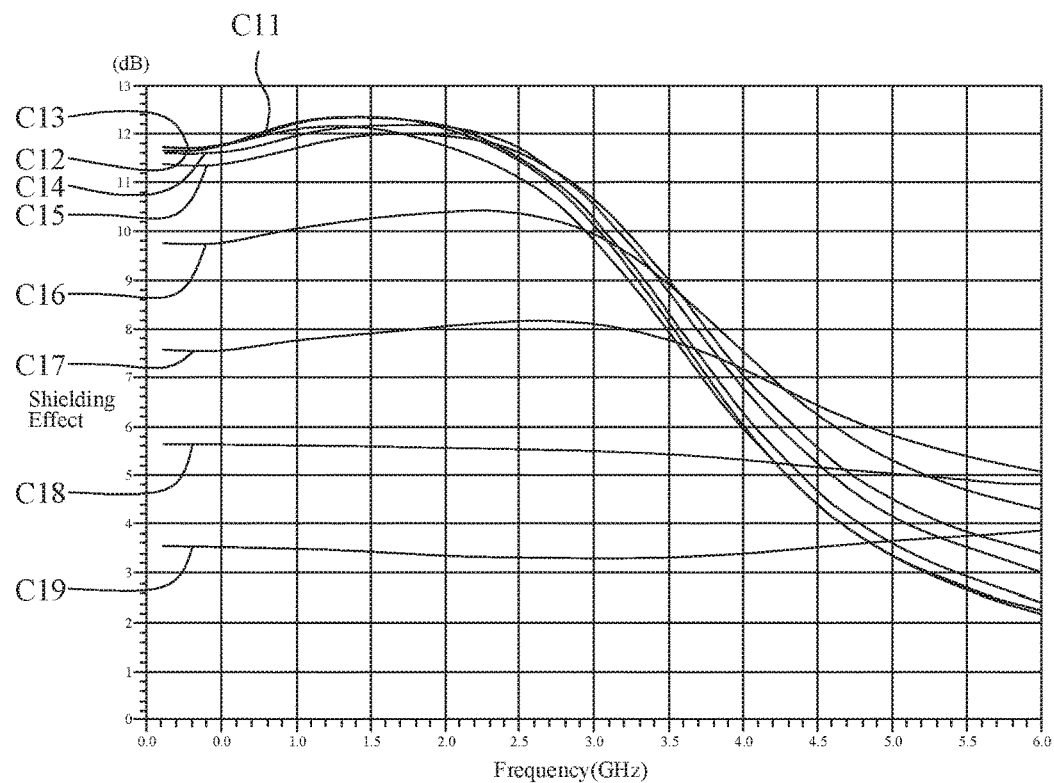
FIG. 11 shows a shielding effectiveness simulation for the semiconductor package structure in accordance with some embodiments of the subject application.

FIG. 11 shows a shielding effectiveness simulation for the semiconductor package structure 1d and the semiconductor package structure 1e in accordance with some embodiments of the subject application. In the shielding effectiveness simulation, the X-axis is frequency (Hz), and the Y-axis shielding effect (dB). The curve C11 shows the shielding effectiveness simulation for the semiconductor package structure 1d; the metal layer 18 may be electrically connected to the compartment shielding wirebonds 15 (FIG. 9). The curve C12 shows the shielding effectiveness simulation for the molding gap being about 50 µm in the semiconductor package structure 1e. The curve C13 shows the shielding effectiveness simulation for the molding gap being about 100 µm in the semiconductor package structure 1e. The curve C14 shows the shielding effectiveness simulation for the molding gap being about 150 µm in the semiconductor package structure 1e. The curve C15 shows the shielding effectiveness simulation for the molding gap being about 200 µm in the semiconductor package structure 1e. The curve C16 shows the shielding effectiveness simulation for the molding gap being about 250 µm in the semiconductor package structure 1e. The curve C17 shows the shielding effectiveness simulation for the molding gap being about 300 µm in the semiconductor package structure 1e. The curve C18 shows the shielding effectiveness simulation for the molding gap being about 350 µm in the semiconductor package structure 1e. The curve C19 shows the shielding effectiveness simulation for no compartment shielding wirebond 15 and only ground pad. It is noted that for the curves C11 to C15, the height of the compartment shielding wirebonds 15a is higher than that of the electronic component 13a, and for the curves C16 to C18 the height of the compartment shielding wirebonds 15a is lower than that of the electronic component 13a. For the curves C11 to C15, there is not much difference in shielding effectiveness between the compartment shielding wirebonds 15 contacting the metal layer 18 and the compartment shielding wirebonds 15a not contacting the metal layer 18. Comparing the curves C11 to C15 and the curves C16 to C18, the shielding effectiveness may be about 11 dB to 12 dB in long term evolution (LTE) frequency band for the curves C11 to C15; however, the shielding effectiveness is low for the curves C16 to C18. Therefore, the shielding effectiveness for the curves C11 to C15 is better than the shielding effectiveness for the curves C16 to C18.

Figure 12:
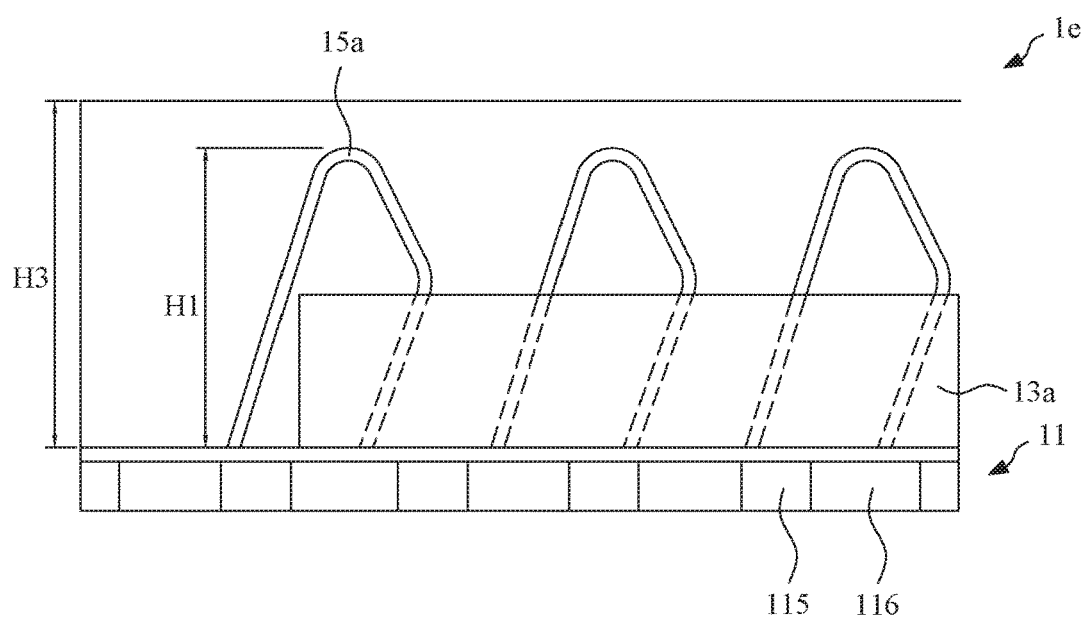
FIG. 12, FIG. 13 and FIG. 14 are cross-sectional views of a compartment shielding wirebond structure in accordance with some embodiments of the subject application.

FIG. 12 shows a side view of the semiconductor package structure 1e in accordance with some embodiments of the subject application. The height H1 of the compartment shielding wirebonds 15a may be about 350 µm, and the height H1 of the compartment shielding wirebonds 15a is higher than that of the electronic component 13a.

Figure 13:
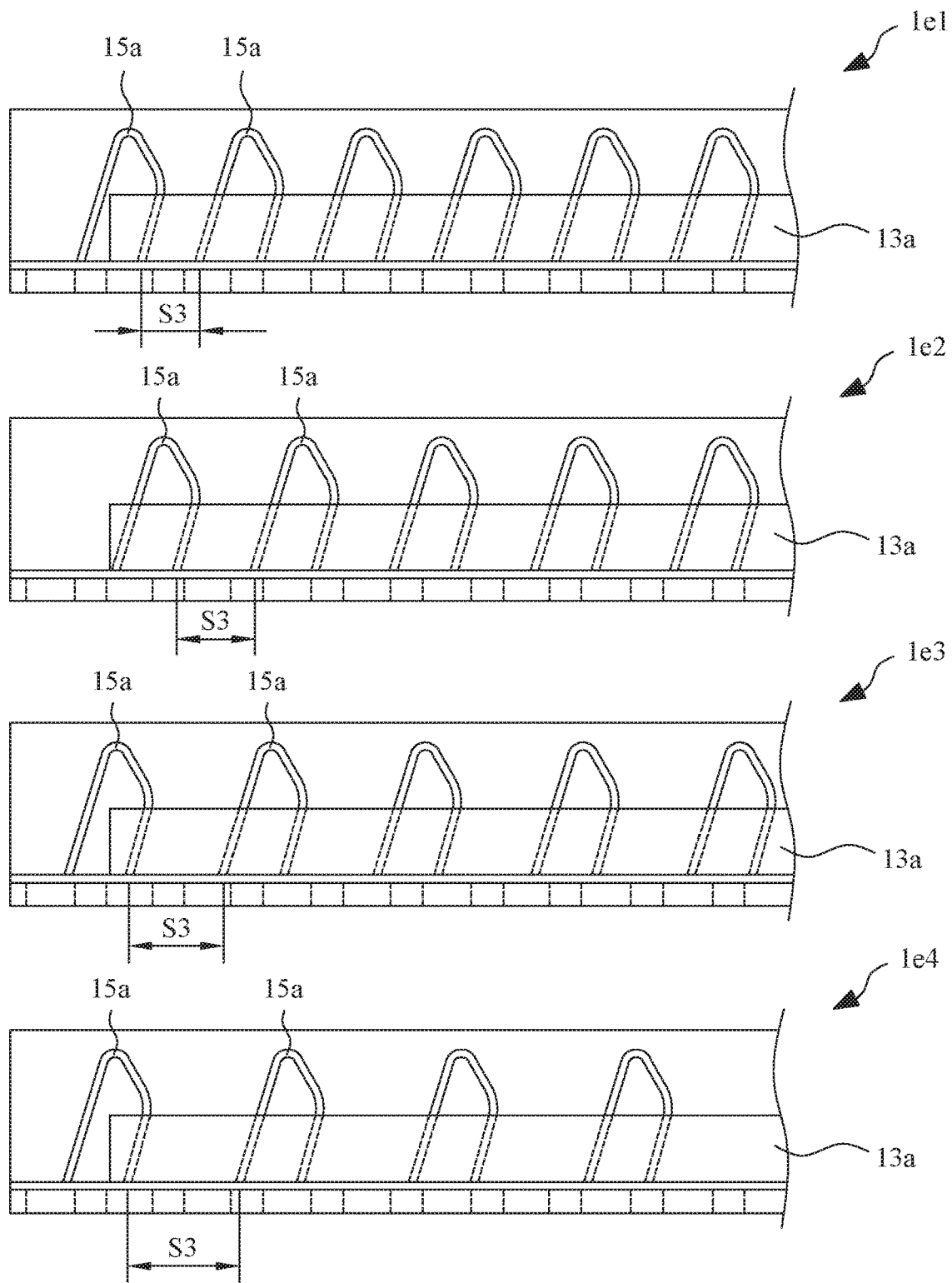

FIG. 13 shows a side view of the semiconductor package structures 1e1 to 1e4 in accordance with some embodiments of the subject application. In the semiconductor package structures 1e1, the wire spacing S2 of the compartment shielding wirebonds 15a may be about 150 µm, and the wire gap S3 between the two adjacent compartment shielding wirebonds 15a may be about 150 µm. In the semiconductor package structures 1e2, the wire spacing S2 of the compartment shielding wirebonds 15a may be about 150 µm, and the wire gap S3 between the two adjacent compartment shielding wirebonds 15a may be about 200 μm. In the semiconductor package structures 1e3, the wire spacing S2 of the compartment shielding wirebonds 15a may be about 150 μm, and the wire gap S3 between the two adjacent compartment shielding wirebonds 15a may be about 250 μm. In the semiconductor package structures 1e4, the wire spacing S2 of the compartment shielding wirebonds 15a may be about 150 μm, and the wire gap S3 between the two adjacent compartment shielding wirebonds 15a may be about 300 μm.

Figure 14:
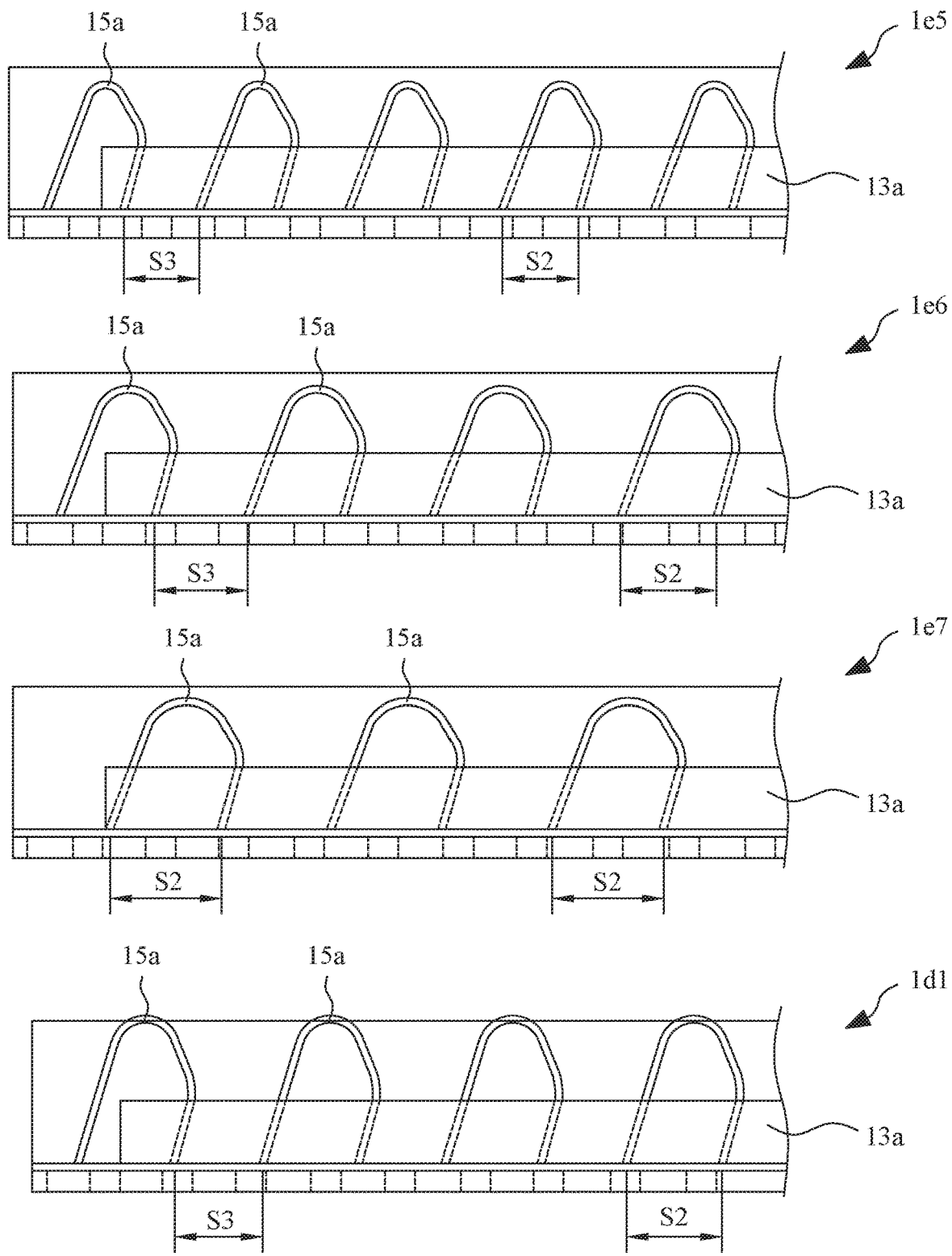

FIG. 14 shows a side view of the semiconductor package structures 1e5 to 1e7 and the semiconductor package structures 1d1 in accordance with some embodiments of the subject application. In the semiconductor package structures 1e5, the wire spacing S2 of the compartment shielding wirebonds 15a may be about 200 μm, and the wire gap S3 between the two adjacent compartment shielding wirebonds 15a may be about 200 μm. In the semiconductor package structures 1e6, the wire spacing S2 of the compartment shielding wirebonds 15a may be about 250 μm, and the wire gap S3 between the two adjacent compartment shielding wirebonds 15a may be about 250 μm. In the semiconductor package structures 1e7, the wire spacing S2 of the compartment shielding wirebonds 15a may be about 300 μm, and the wire gap S3 between the two adjacent compartment shielding wirebonds 15a may be about 300 μm. In the semiconductor package structures 1d1, the wire spacing S2 of the compartment shielding wirebonds 15 may be about 250 μm, and the wire gap S3 between the two adjacent compartment shielding wirebonds 15 may be about 250 μm. The height H1 of the compartment shielding wirebonds 15a may be about 350 μm, and the height H3 of the encapsulant 17 may be about 430 μm.

Figure 15:
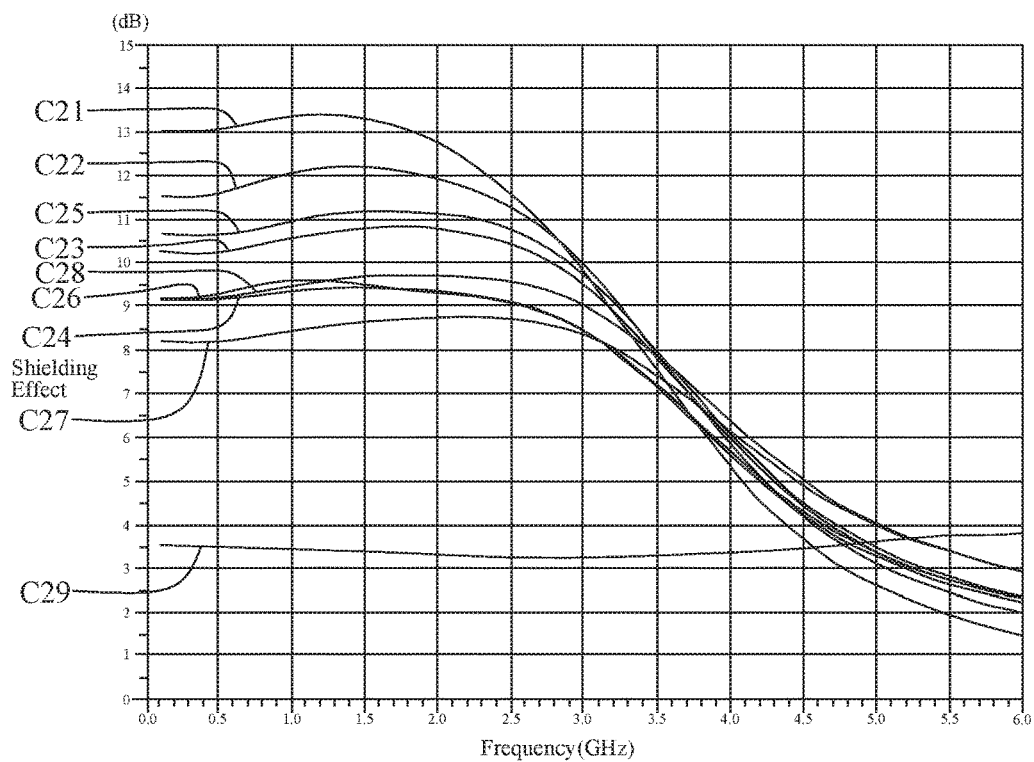
FIG. 15 shows a shielding effectiveness simulation for the semiconductor package structure in accordance with some embodiments of the subject application.

FIG. 15 shows a shielding effectiveness simulation for the semiconductor package structures 1e1 to 1e7 and the semiconductor package structure 1d1 in accordance with some embodiments of the subject application. The curve C21 shows the shielding effectiveness simulation for the semiconductor package structure 1e1. The curve C22 shows the shielding effectiveness simulation for the semiconductor package structure 1e2. The curve C23 shows the shielding effectiveness simulation for the semiconductor package structure 1e3. The curve C24 shows the shielding effectiveness simulation for the semiconductor package structure 1e4. The curve C25 shows the shielding effectiveness simulation for the semiconductor package structure 1e5. The curve C26 shows the shielding effectiveness simulation for the semiconductor package structure 1e6. The curve C27 shows the shielding effectiveness simulation for the semiconductor package structure 1e7. The curve C28 shows the shielding effectiveness simulation for the semiconductor package structure 1d1. The curve C29 shows the shielding effectiveness simulation for no compartment shielding wirebond 15a and only ground pad. Comparing the curves C26 and C28, there is not much difference in shielding effectiveness between the compartment shielding wirebonds 15 contacting the metal layer 18 (the curve C28) and the compartment shielding wirebonds 15a not contacting the metal layer 18 (the curve C26). The shielding effectiveness may be about 13 dB for below 2 GHz for the curve C21, and the shielding effectiveness for the curve C21 is higher than the other curves. Therefore, the shielding effectiveness for the small wire spacing and the small wire gap is better than the shielding effectiveness for the big wire spacing and the big wire gap.

Figure 16:
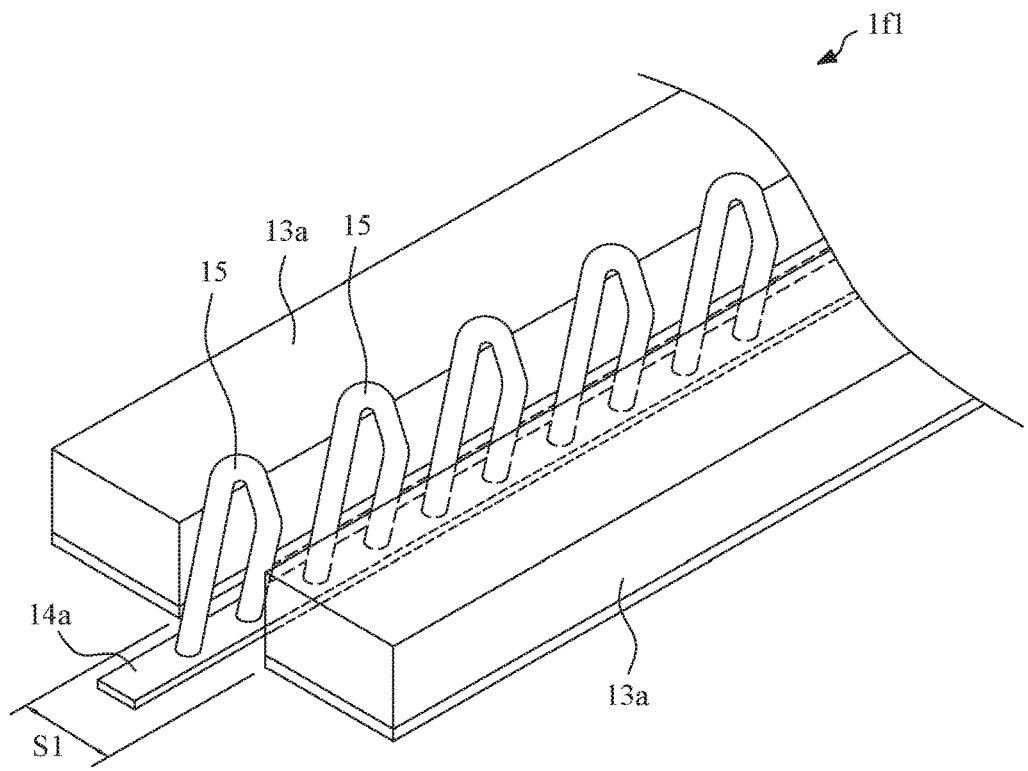
FIG. 16, FIG. 17, FIG. 18, FIG. 19 and FIG. 20 are cross-sectional views of a compartment shielding wirebond structure in accordance with some embodiments of the subject application.

FIG. 16 shows a perspective view showing the electronic component 13a, the shielding pad 14a and the compartment shielding wirebonds 15 of a semiconductor package structure 1f1 in accordance with some embodiments of the subject application. The gap S1 between the two adjacent electronic component 13a may be about 200 μm.

Figure 17:
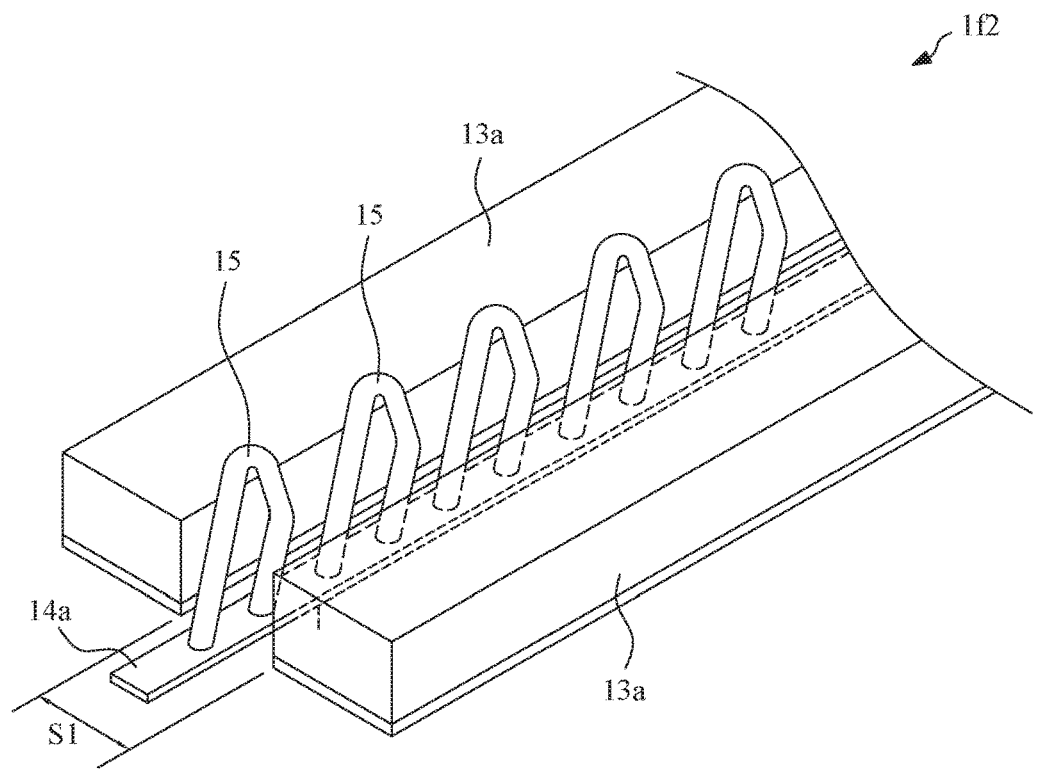

FIG. 17 shows a perspective view showing the electronic component 13a, the shielding pad 14a and the compartment shielding wirebonds 15 of a semiconductor package structure 1f2 in accordance with some embodiments of the subject application. The gap S1 between the two adjacent electronic component 13a may be about 250 μm.

Figure 18:
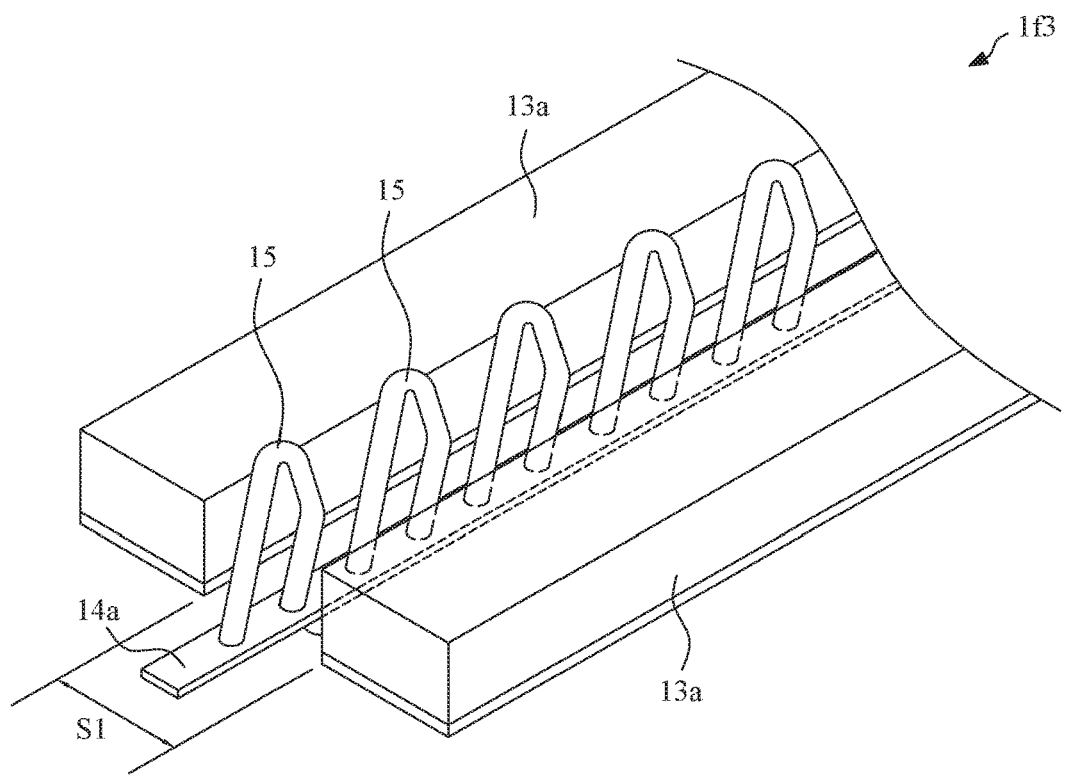

FIG. 18 shows a perspective view showing the electronic component 13a, the shielding pad 14a and the compartment shielding wirebonds 15 of a semiconductor package structure 1f3 in accordance with some embodiments of the subject application. The gap S1 between the two adjacent electronic component 13a may be about 300 μm.

Figure 19:
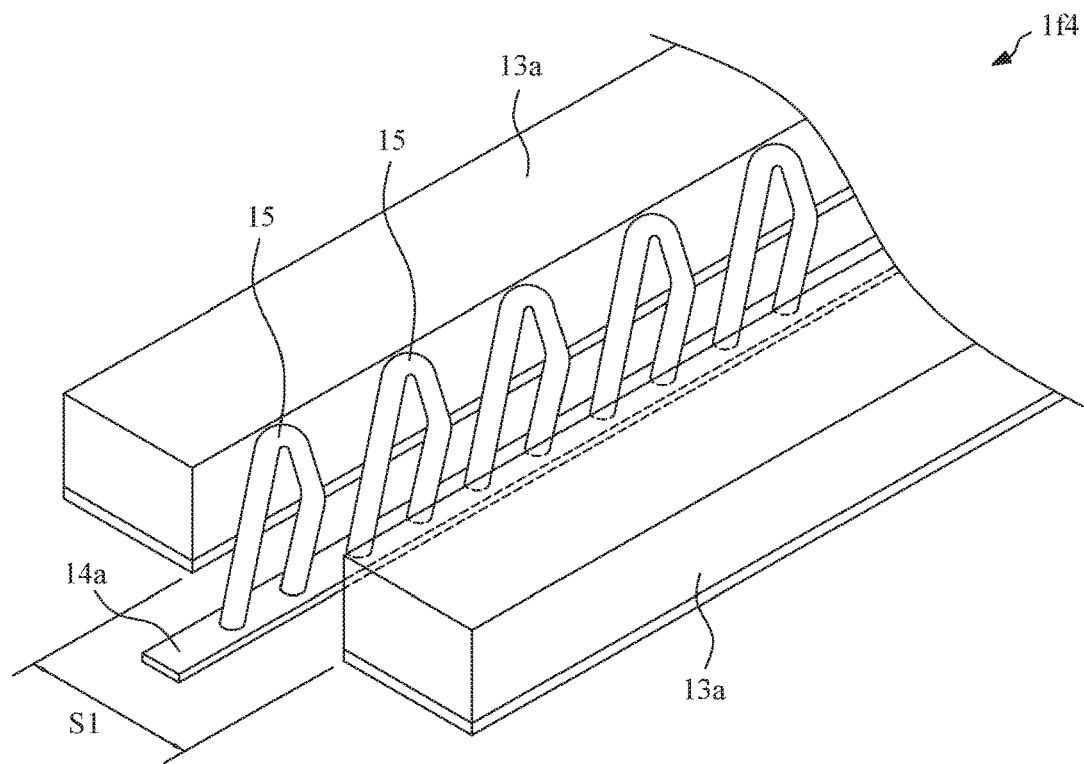

FIG. 19 shows a perspective view showing the electronic component 13a, the shielding pad 14a and the compartment shielding wirebonds 15 of a semiconductor package structure 1f4 in accordance with some embodiments of the subject application. The gap S1 between the two adjacent electronic component 13a may be about 350 μm.

Figure 20:
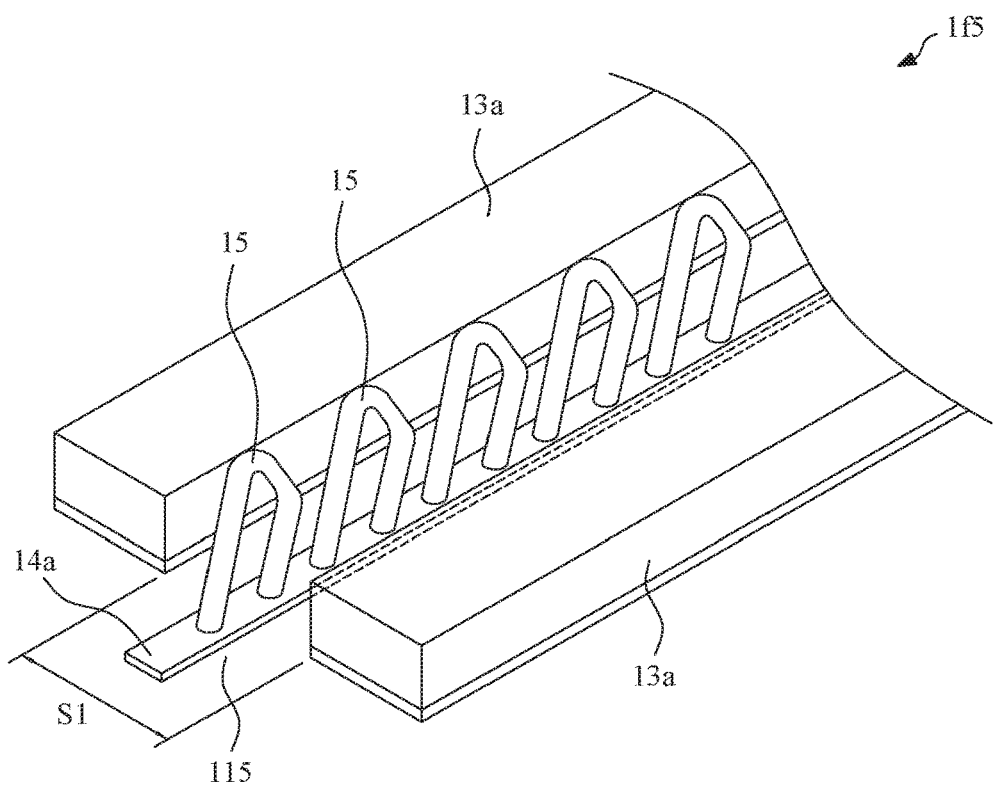

FIG. 20 shows a perspective view showing the electronic component 13a, the shielding pad 14a and the compartment shielding wirebonds 15 of a semiconductor package structure 1f5 in accordance with some embodiments of the subject application. The gap S1 between the two adjacent electronic component 13a may be about 400 μm.

Figure 21:
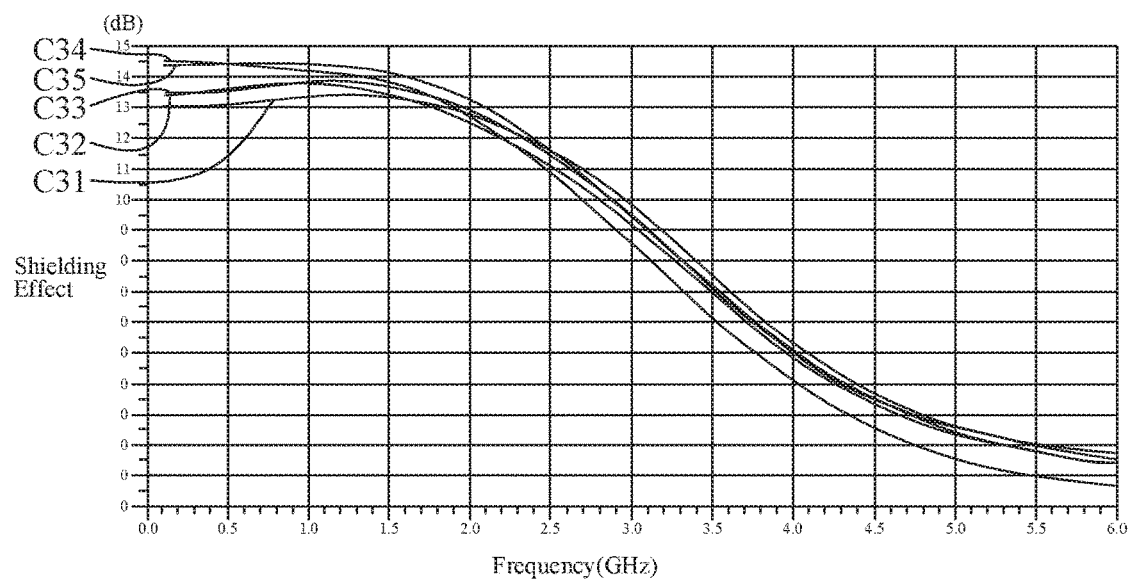
FIG. 21 shows a shielding effectiveness simulation for the semiconductor package structure in accordance with some embodiments of the subject application.

FIG. 21 shows a shielding effectiveness simulation for the semiconductor package structures 1f1 to 1f5 in accordance with some embodiments of the subject application. The curve C31 shows the shielding effectiveness simulation for the semiconductor package structure 1f1. The curve C32 shows the shielding effectiveness simulation for the semiconductor package structure 1f2. The curve C33 shows the shielding effectiveness simulation for the semiconductor package structure 1f3. The curve C34 shows the shielding effectiveness simulation for the semiconductor package structure 1f4. The curve C35 shows the shielding effectiveness simulation for the semiconductor package structure 1f5. Therefore, the shielding effectiveness has no significant effect on the component gap between the two adjacent electronic component 13a.

Figure 22:
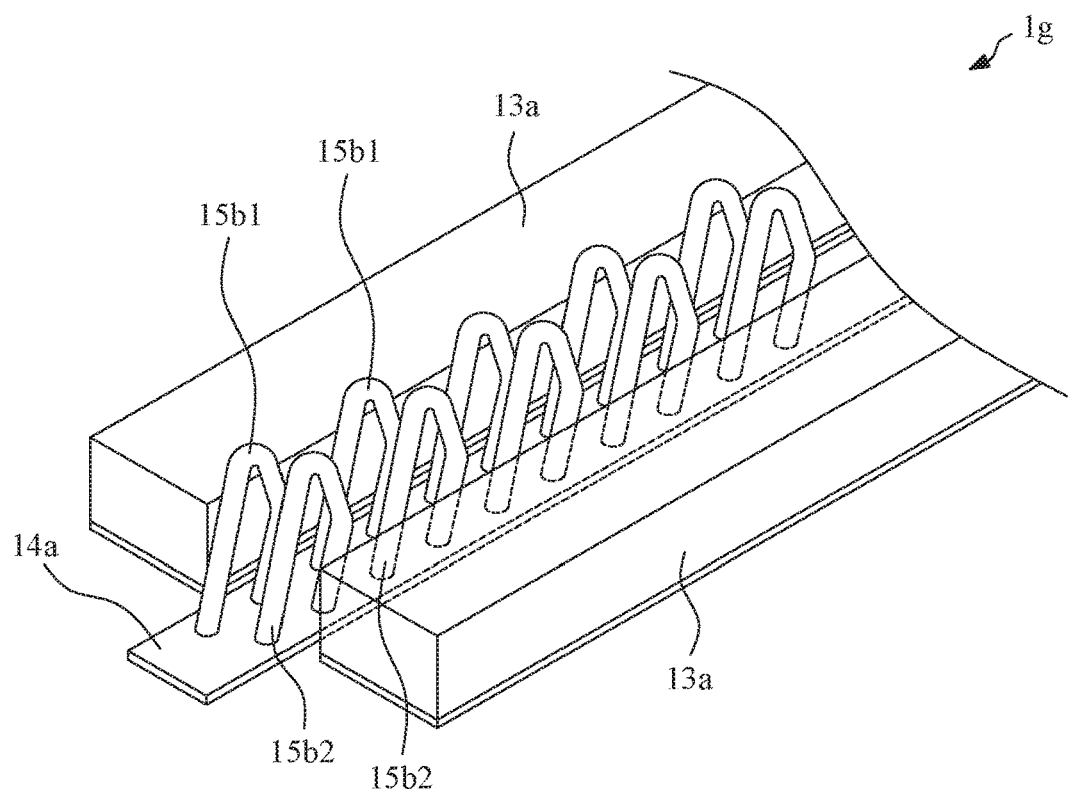
FIG. 22 and FIG. 23 are cross-sectional views of a compartment shielding wirebond structure in accordance with some embodiments of the subject application.
Figure 23:
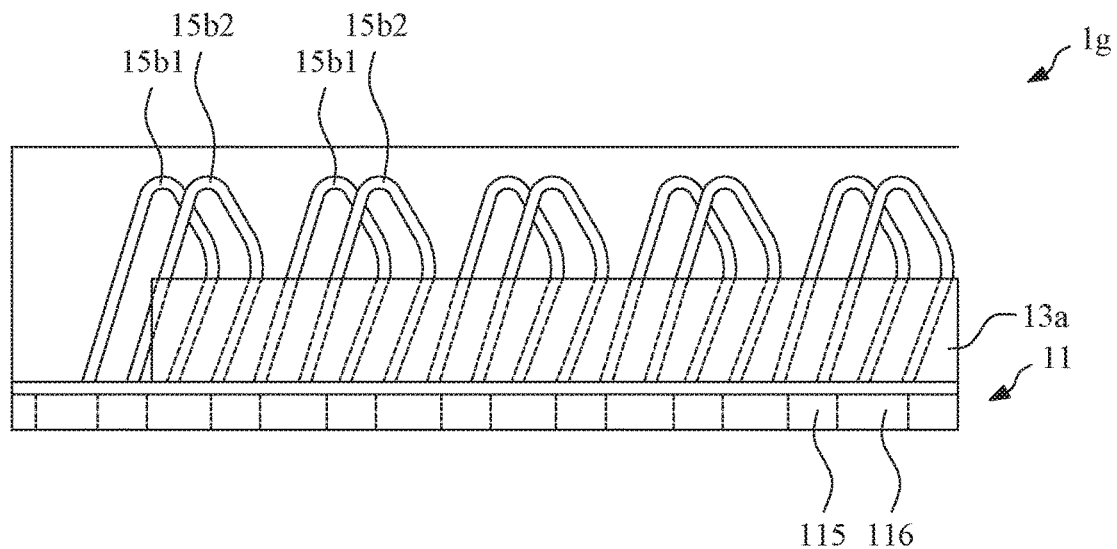
Figure 24:
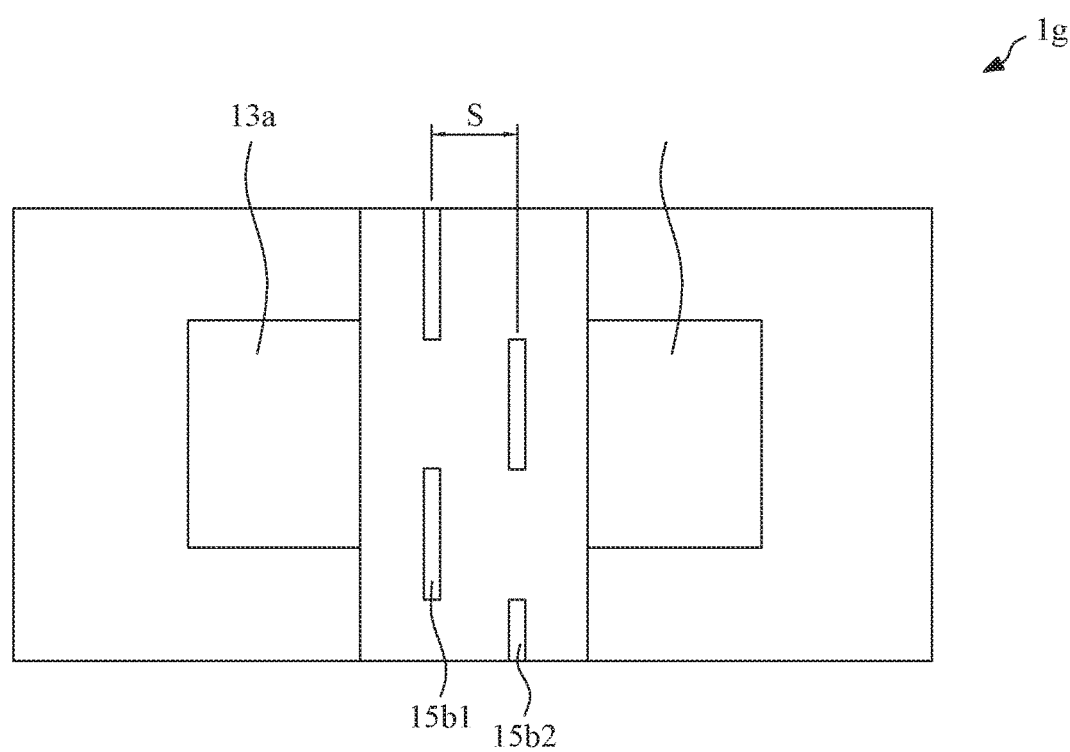
FIG. 24 is a top view of a semiconductor package structure in accordance with some embodiments of the subject application.

FIG. 22 shows a perspective view showing the electronic component 13a, the shielding pad 14a and the compartment shielding wirebonds 15b1, 15b2 of a semiconductor package structure 1g in accordance with some embodiments of the subject application. FIG. 23 shows a side view showing the electronic component 13a, the shielding pad 14a and the compartment shielding wirebonds 15b1, 15b2 of a semiconductor package structure 1g in accordance with some embodiments of the subject application. FIG. 24 shows a top view showing the electronic component 13a, the shielding pad 14a and the compartment shielding wirebonds 15 of a semiconductor package structure 1g in accordance with some embodiments of the subject application. The semiconductor package structures 1g may include two compartment shielding wirebond rows. The first compartment shielding wirebond row includes a plurality of compartment shielding wirebonds 15b1, and the second compartment shielding wirebond row includes a plurality of compartment shielding wirebonds 15b2. The compartment shielding wirebonds 15b1 and the compartment shielding wirebonds 15b2 are staggered. The first compartment shielding wirebond row is parallel with the second compartment shielding wirebond row, and there is a distance S between the first compartment shielding wirebond row and the second compartment shielding wirebond row.

Figure 25:
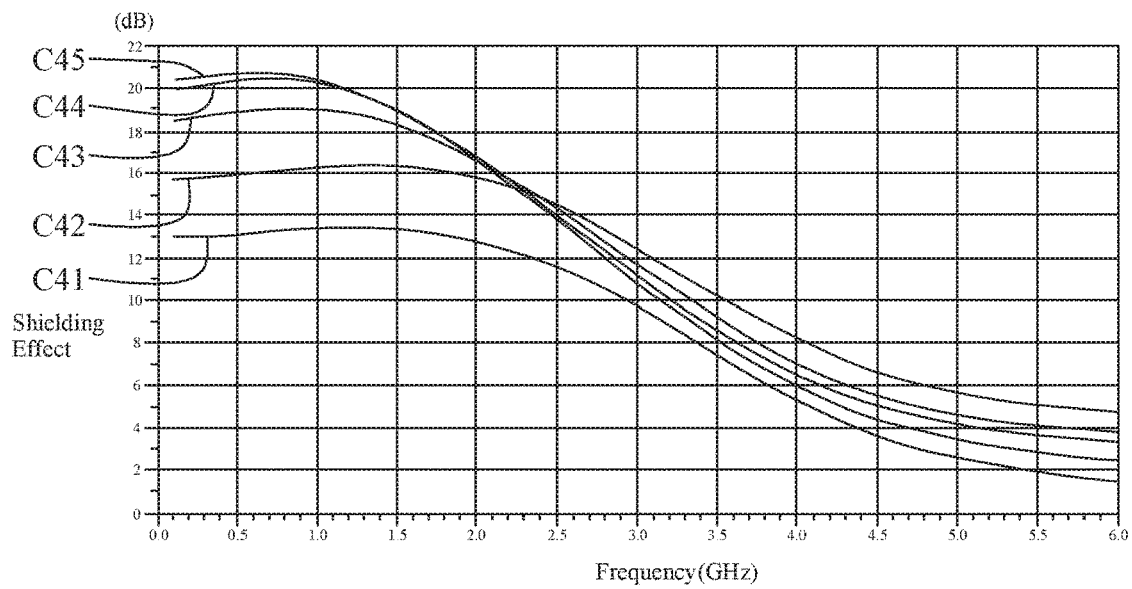
FIG. 25 and FIG. 26 show a shielding effectiveness simulation for the semiconductor package structure in accordance with some embodiments of the subject application.

FIG. 25 shows a shielding effectiveness simulation for the semiconductor package structure 1g and the semiconductor package structure 1e in accordance with some embodiments of the subject application. The curve C41 shows the shielding effectiveness simulation for the semiconductor package structure 1e; the height H1 of the compartment shielding wirebonds 15a may be about 350 µm. The curve C42 shows the shielding effectiveness simulation for the height H1 of the compartment shielding wirebonds 15b1, 15b2 being about 200 µm and the distance S being about 74 µm in the semiconductor package structure 1g. The curve C43 shows the shielding effectiveness simulation for the height H1 of the compartment shielding wirebonds 15b1, 15b2 being about 250 µm and the distance S being about 83 µm in the semiconductor package structure 1g. The curve C44 shows the shielding effectiveness simulation for the height H1 of the compartment shielding wirebonds 15b1, 15b2 being about 300 µm and the distance S being about 92 µm in the semiconductor package structure 1g. The curve C45 shows the shielding effectiveness simulation for the height H1 of the compartment shielding wirebonds 15b1, 15b2 being about 350 µm and the distance S being about 101 µm in the semiconductor package structure 1g. Comparing the curve C41 and the curves C42 to C45, the shielding effectiveness for the curve C41 is lower than the shielding effectiveness for the curves C42 to C45. Therefore, the shielding effectiveness for the curves C42 to C45 (two compartment shielding wirebond rows) is better than the shielding effectiveness for the curve C41 (one compartment shielding wirebond rows).

Figure 26:
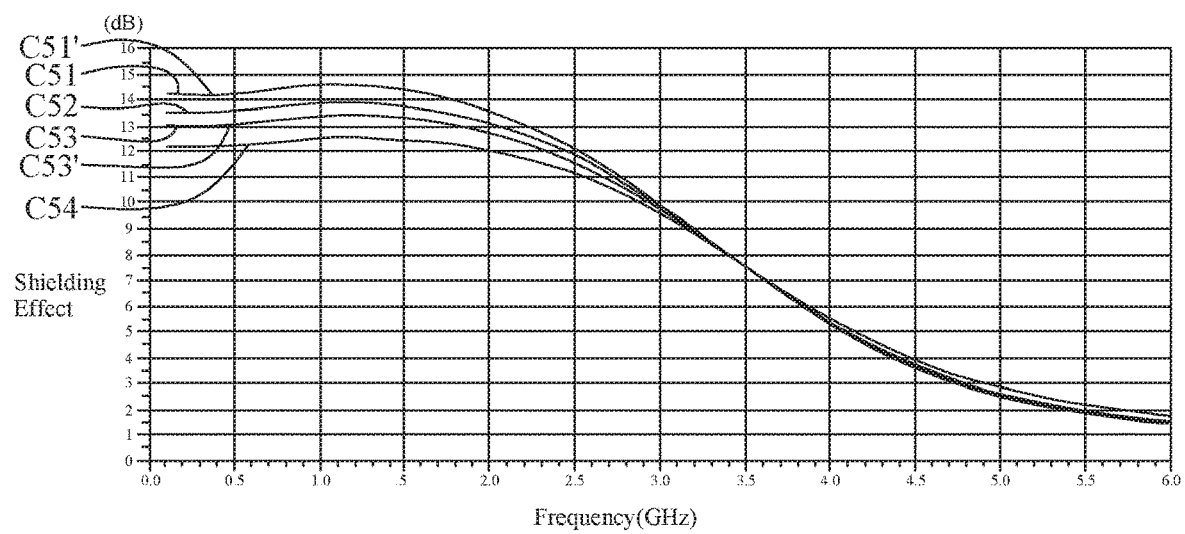

FIG. 26 shows a shielding effectiveness simulation for the semiconductor package structure 1e in accordance with some embodiments of the subject application. In the shielding effectiveness simulation, the height H1 of the compartment shielding wirebonds 15a may be about 350 µm, and the wire spacing of the compartment shielding wirebonds 15a may be about 150 µm. The curve C51 shows the shielding effectiveness simulation for the wire diameter of the compartment shielding wirebonds 15a being about 33 µm and for the Cu wire material in the semiconductor package structure 1e. The curve C51' shows the shielding effectiveness simulation for the wire diameter of the compartment shielding wirebonds 15a being about 33 µm and for the Au wire material in the semiconductor package structure 1e. The curve C52 shows the shielding effectiveness simulation for the wire diameter of the compartment shielding wirebonds 15a being about 30 µm and for the Cu wire material in the semiconductor package structure 1e. The curve C53 shows the shielding effectiveness simulation for the wire diameter of the compartment shielding wirebonds 15a being about 25 µm and for the Cu wire material in the semiconductor package structure 1e. The curve C53' shows the shielding effectiveness simulation for the wire diameter of the compartment shielding wirebonds 15a being about 25 µm and for the Au wire material in the semiconductor package structure 1e. The curve C54 shows the shielding effectiveness simulation for the wire diameter of the compartment shielding wirebonds 15a being about 20 µm and for the Cu wire material in the semiconductor package structure 1e. In the shielding effectiveness simulation, the shielding effectiveness for the large wire diameter is better at low frequency (e.g., <3.0 GHz). And there is no different shielding effectiveness between Cu wire material and Au wire material.

Figure 27A:
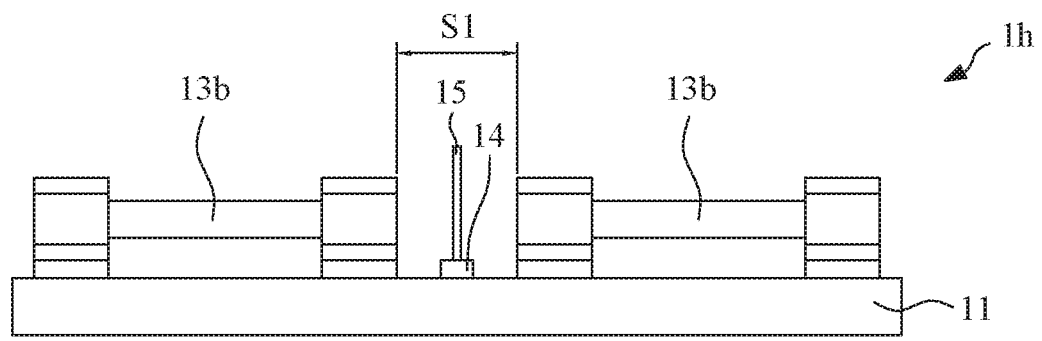
FIG. 27A is a cross-sectional view of a semiconductor package structure in accordance with some embodiments of the subject application.
Figure 27B:
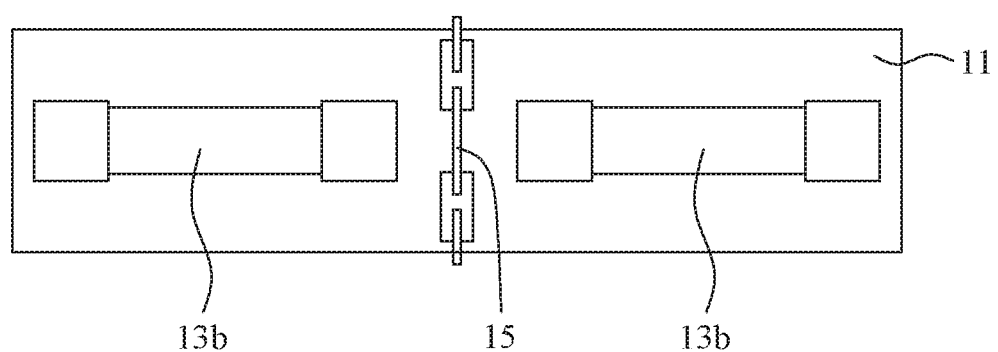
FIG. 27B is a top view of a semiconductor package structure in accordance with some embodiments of the subject application.

FIG. 27A shows a side view showing the substrate structure 11, the electronic component 13b, the shielding pads 14 and the compartment shielding wirebonds 15 of a semiconductor package structure 1h in accordance with some embodiments of the subject application. FIG. 27B shows a top view showing the substrate structure 11, the electronic component 13b, the shielding pads 14 and the compartment shielding wirebonds 15 of a semiconductor package structure 1h in accordance with some embodiments of the subject application. In some embodiments, the electronic component 13b may be passive elements. According to the subject application, the gap S1 between two adjacent electronic component 13b may be 200 µm.

Figure 28A:
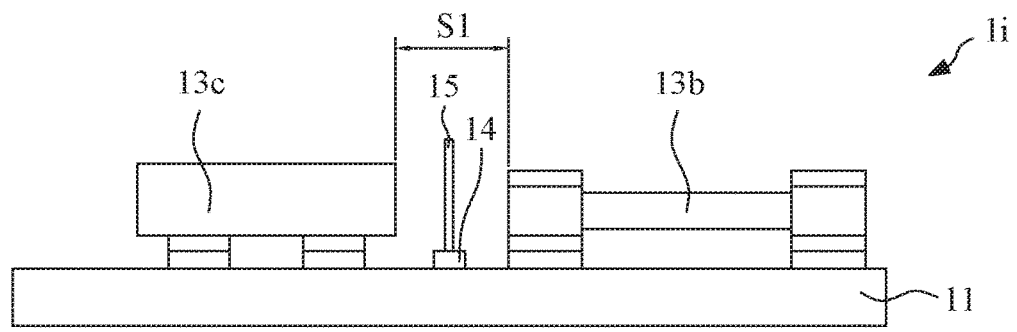
FIG. 28A is a cross-sectional view of a semiconductor package structure in accordance with some embodiments of the subject application.
Figure 28B:
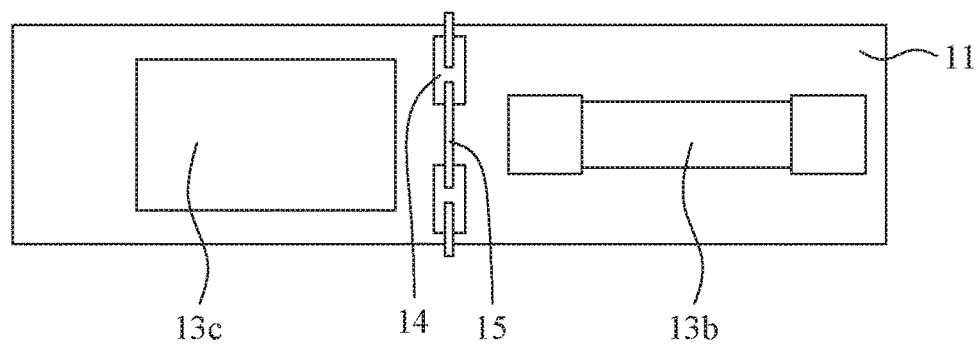
FIG. 28B is a top view of a semiconductor package structure in accordance with some embodiments of the subject application.

FIG. 28A shows a side view showing the substrate structure 11, the electronic components 13b, 13c, the shielding pads 14 and the compartment shielding wirebonds 15 of a semiconductor package structure 1i in accordance with some embodiments of the subject application. FIG. 28B shows a top view showing the substrate structure 11, the electronic components 13b, 13c, the shielding pads 14 and the compartment shielding wirebonds 15 of a semiconductor package structure 1i in accordance with some embodiments of the subject application. In some embodiments, the semiconductor die 13b may be passive elements, and the semiconductor die 13c may be chips or chip scale package (CSP). According to the subject application, the gap S1 between two adjacent electronic components 13b and 13c may be 200 µm.

Figure 29A:
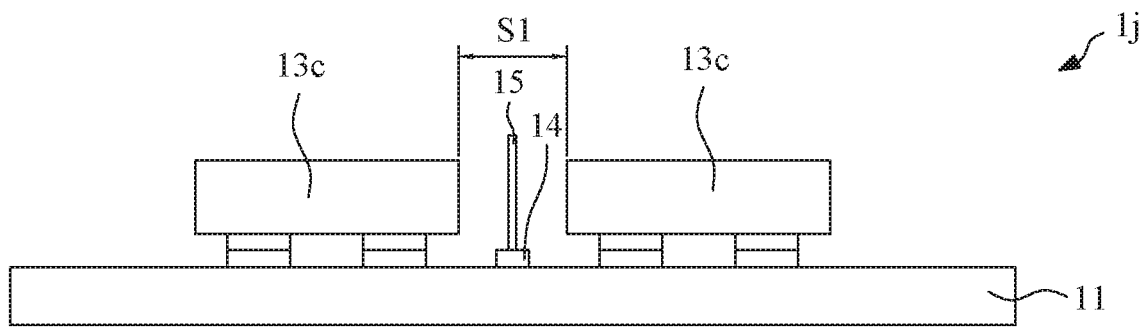
FIG. 29A is a cross-sectional view of a semiconductor package structure in accordance with some embodiments of the subject application.
Figure 29B:
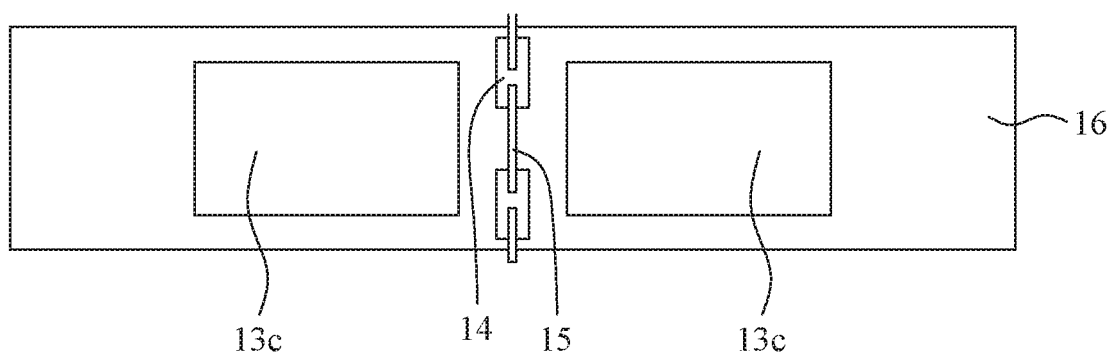
FIG. 29B is a top view of a semiconductor package structure in accordance with some embodiments of the subject application.

FIG. 29A shows a side view showing the substrate structure 11, the electronic component 13c, the shielding pads 14 and the compartment shielding wirebonds 15 of a semiconductor package structure 1j in accordance with some embodiments of the subject application. FIG. 29B shows a top view showing the substrate structure 11, the electronic component 13c, the shielding pads 14 and the compartment shielding wirebonds 15 of a semiconductor package structure 1j in accordance with some embodiments of the subject application. In some embodiments, the electronic component 13c may be chips or chip scale package (CSP). According to the subject application, the gap S1 between two adjacent electronic components 13b may be 200 µm.

Figure 30:
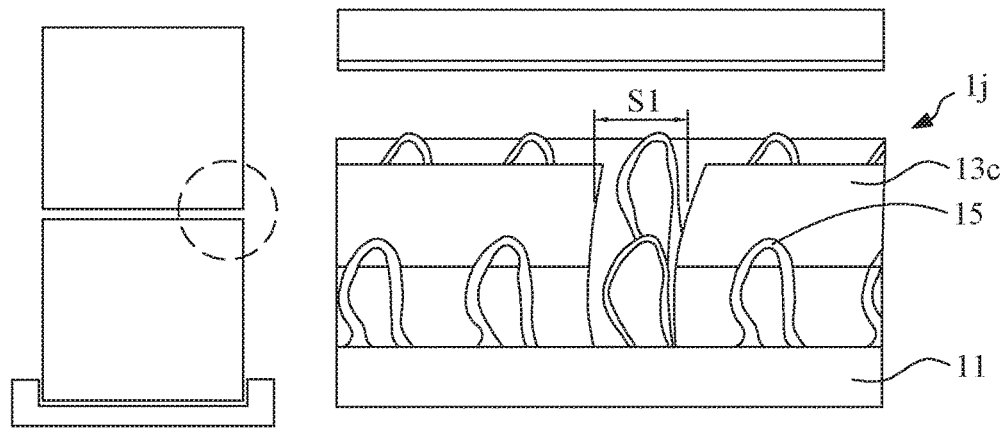
FIG. 30 is a cross-sectional view of a semiconductor package structure in accordance with some embodiments of the subject application.

FIG. 30 shows an enlarged view of the substrate structure 11, the electronic component 13c and the compartment shielding wirebonds 15 of the semiconductor package structure 1j in accordance with some embodiments of the subject application. The electronic component 13c has a rectangular or a rectangle-like profile, which may be characterized by a longer side and a shorter side. In addition to be surrounded by the compartment shielding wirebonds 15 at the shorter side, as previously illustrated in FIG. 29A and FIG. 29B, the compartment shielding wirebonds 15 can be arranged along the longer sides of the electronic component 13c. According to the subject application, the gap S1 between shorter sides of the two adjacent electronic components 13c may be about 200 µm.

FIG. 31A to FIG. 31D show a top view of the semiconductor die 13d, the shielding pads 14a, 14b and the cage shielding wirebonds 15c of a semiconductor package structure 1k in accordance with some embodiments of the subject application. FIG. 32 shows a cross-sectional view of a semiconductor package structure 1k in accordance with some embodiments of the subject application.

Figure 31A:
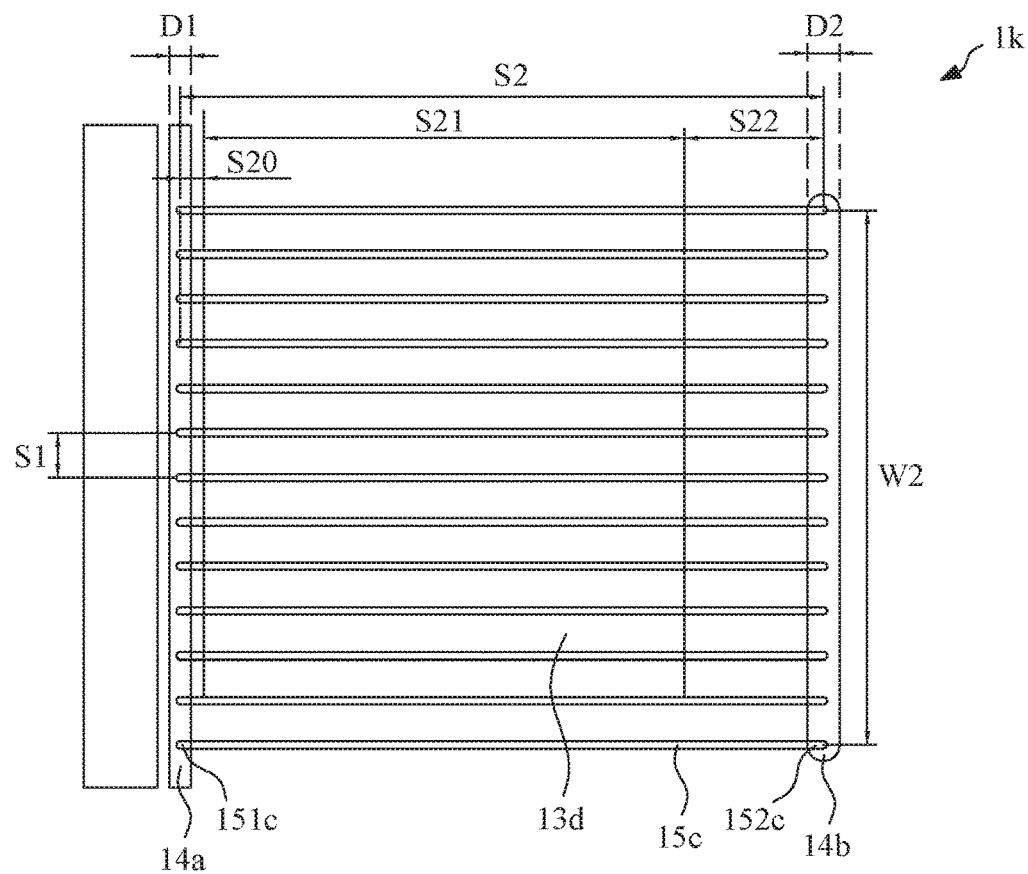
FIG. 31A, FIG. 31B, FIG. 31C and FIG. 31D are top views of a cage shielding wirebond structure of a semiconductor package structure in accordance with some embodiments of the subject application.
Figure 32:
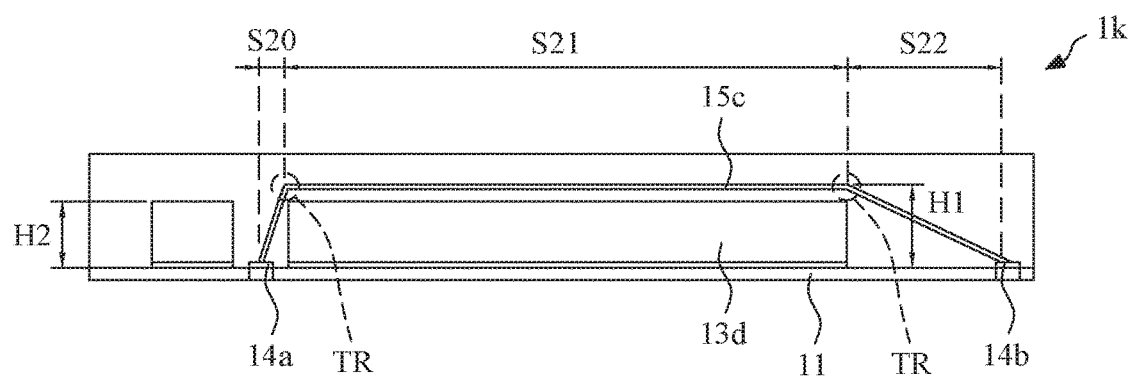
FIG. 32 is a cross-sectional view of a cage shielding wirebond structure in accordance with some embodiments of the subject application.

Referring to FIG. 31A, the shielding pads 14a, 14b are disposed on two sides of the semiconductor die 13d. The shielding pads 14a and 14b are separated apart from each other. Each of the shielding pads 14a and 14b has a strip-profile or a strip-like profile. The cage shielding wirebonds 15c are electrically connected to the shielding pads 14a and 14b. The first bond 151c of the cage shielding wirebonds 15c is electrically connected to the shielding pad 14a, and the second bond 152 of the cage shielding wirebonds 15c is electrically connected to the shielding pad 14b. The gap S1 between the two adjacent cage shielding wirebonds 15c may be from about 100 μm to 300 μm, and the wire spacing S2 between the first bond 151c and the second bond 152c of the cage shielding wirebonds 15c may be about 2690 μm. The wire spacing S2 may include three distances S20, S21 and S22, where S21 is approximately a length of the semiconductor die 13d, and S20 is a distance between the first bond 151c on the shielding pad 14a and a left side of the semiconductor die 13d, and S22 is a distance between the second bond 152c on the shielding pad 14b and a right side of the semiconductor die 13d. The area of the semiconductor die 13d may be defined by S21 and W2. In some embodiments, S21 may be about 2000 μm and W2 may be about 2000 μm. In some embodiments, the shielding pad 14a on a left side of the semiconductor die 13d has a first width D1, and the shielding pad 14b on a right side of the semiconductor die 13d has a second width D2. The first bond 151c is located on the shielding pad 14a and the second bond 152c is located on the shielding pad 14b. In some embodiments, the first bond 151c is a ball bond thereby occupying a narrower space, and the second bond 152c is a wedge bond thereby occupying a wider space. As a result, the first width D1 of the shielding pad 14a is narrower than the second width D2 of the shielding pad 14b. In some embodiments, the difference between the distances first width D1 and the second width D2 can be in a range from about 30 μm to about 60 μm. In some embodiments, as illustrated in FIG. 31A, the electronic component 13d is closer to the shielding pad 14a than the shielding pad 14b.

Figure 31B:
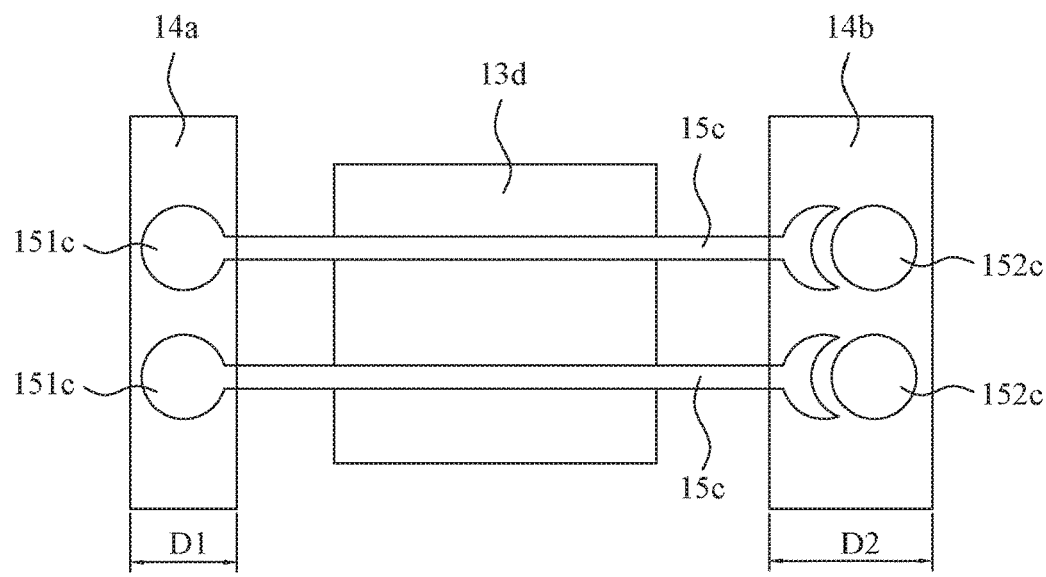

Referring to FIG. 31B, the cage shielding wirebonds 15c traverse the electronic component 13d. The electronic component 13d has a rectangular or a rectangle-like profile, which includes four sides. The compartment shielding wirebonds 15c substantially extend along two of the four sides of the electronic component 13d, and crosses over other two sides of the electronic component 13d.

In some embodiments, the first bond 151c contacts the shielding pad 14a. The second bond 152c contacts the shielding pad 14b. The shielding pad 14a on a left side of the semiconductor die 13d has a first width D1, and the shielding pad 14b on a right side of the semiconductor die 13d has a second width D2. The first bond 151c is located on the shielding pad 14a and the second bond 152c is located on the shielding pad 14b. In some embodiments, the first bond 151c is a ball bond thereby occupying a narrower space, and the second bond 152c is a wedge bond thereby occupying a wider space. As a result, the first width D1 of the shielding pad 14a is narrower than the second width D2 of the shielding pad 14b. In some embodiments, the difference between the distances first width D1 and the second width D2 can be in a range from about 30 μm to about 60 μm. The shielding pads 14a and 14b have a strip profile or a strip-like profile. The electronic component 13d is closer to the shielding pad 14a than the shielding pad 14b.

Figure 31C:
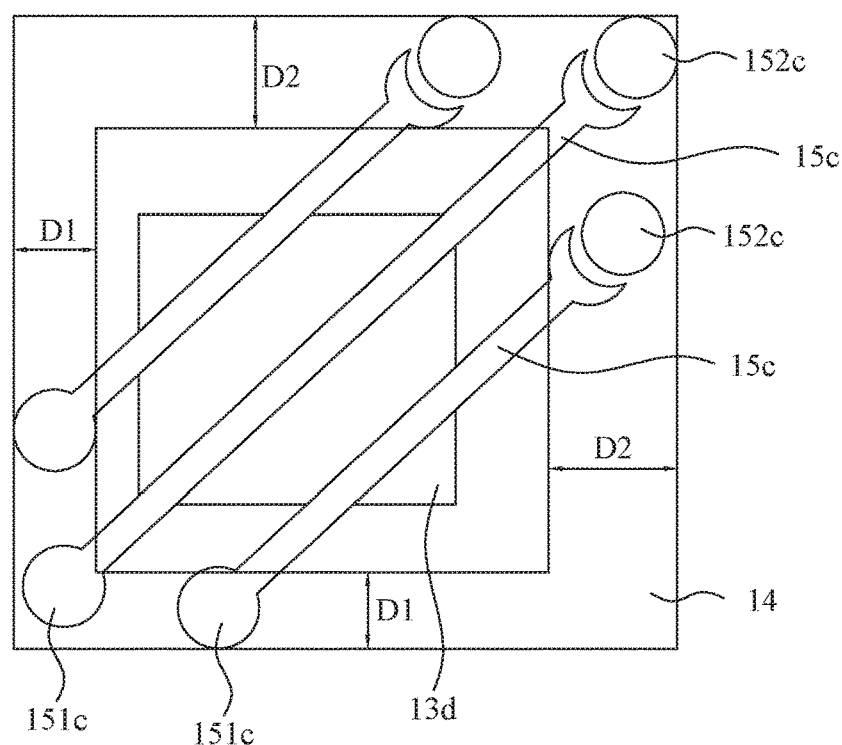

Referring to FIG. 31C, the cage shielding wirebonds 15c traverse the electronic component 13d along a diagonal direction. The electronic component 13d has a rectangular or a rectangle-like profile. The cage shielding wirebonds 15c substantially extend along a diagonal of the electronic component 13d. In some embodiments, the first bond 151c and the second bond 152c contact the shielding pad 14. The shielding pad 14 could have a square-ring profile or a square-ring-like profile. The electronic component 13d is surrounded by the shielding pad 14. In some embodiments, the shielding pad 14 includes a first portion having a first width D1 connected to the first bond 151c and a second portion having a second width D2 connected to the second bond 152c. As illustrated in FIG. 31C, the first portion is connected with the second portion. In some embodiments, the first bond 151c is a ball bond thereby occupying a narrower space, and the second bond 152c is a wedge bond thereby occupying a wider space. As a result, the first width D1 of the first portion is narrower than the second width D2 of the second portion. In some embodiments, the difference between the first width D1 and the second width D2 can be in a range from about 30 μm to about 60 μm. As illustrated in FIG. 31C, the electronic component 13d is closer to the first portion than the second portion of the shielding pad 14.

Figure 31D:
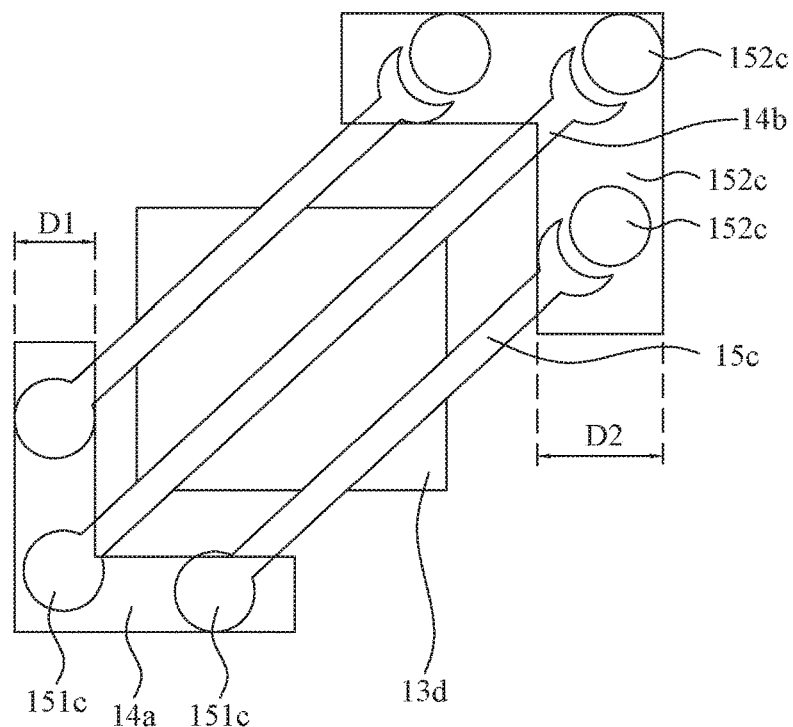

Referring to FIG. 31D, the cage shielding wirebonds 15c traverse the electronic component 13d along a diagonal direction. The electronic component 13d has a rectangular or a rectangle-like profile. The cage shielding wirebonds 15c substantially extend along a diagonal of the electronic component 13d. The shielding pad 14a is separated from the shielding pad 14b. As illustrated in FIG. 31D, the shielding pad 14a on a lower left side of the semiconductor die 13d has a first width D1, and the shielding pad 14b on an upper right side of the semiconductor die 13d has a second width D2. The first bond 151c is located on the shielding pad 14a and the second bond 152c is located on the shielding pad 14b. In some embodiments, the first bond 151c is a ball bond thereby occupying a narrower space, and the second bond 152c is a wedge bond thereby occupying a wider space. As a result, the first width D1 of the shielding pad 14a is narrower than the second width D2 of the shielding pad 14b. In some embodiments, the difference between the first width D1 and the second width D2 can be in a range from about 30 μm to about 60 μm. The shielding pads 14a and 14b may have a corner-profile or a L-like profile with suitable dimension, as exemplified in FIG. 31D. In some embodiments, the electronic component 13d is closer to the shielding pad 14a than the shielding pad 14b.

Referring to FIG. 32, the cage shielding wirebonds 15c traverse the semiconductor die 13d, and are used for providing a shielding effect for the semiconductor die 13d. Distance S20 is a distance between the first bond 151c on the shielding pad 14a and a left side of the semiconductor die 13d, distance S21 is approximately a length of the semiconductor die 13d, and distance S22 is a separation between the second bond 152c on the shielding pad 14b and a right side of the semiconductor die 13d. The height H1 of the cage shielding wirebonds 15c may be about 300 μm, and the height H1 of the cage shielding wirebonds 15c is higher than the height H2 of the semiconductor die 13d. Referring FIG. 31A and FIG. 32, the gap S1 between the two adjacent cage shielding wirebonds 15c may be about 100 μm to 300 μm, and the wire spacing S2 between the first bond 151c and the second bond 152c of the cage shielding wirebonds 15c may be about 2690 μm. The wire spacing S2 may include three distances S20, S21 and S22 which connect to each other by at least one turning portion TR of the cage shielding wirebonds 15c. The size of the semiconductor die 13d may be about S21 (2000 μm)×W2 (2000 μm)×H2 (250 μm).

Figure 33:
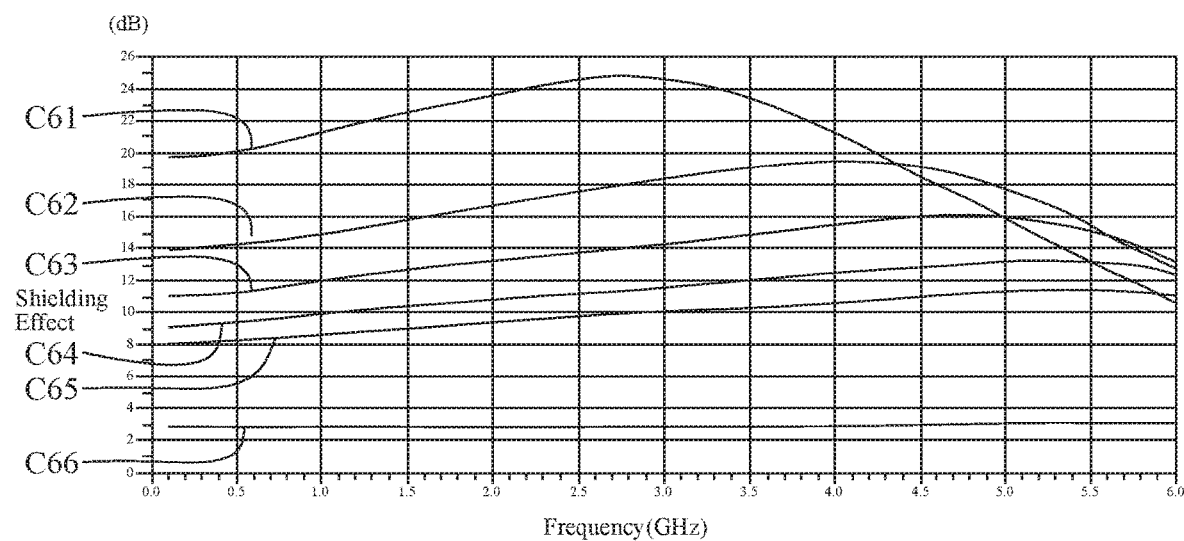
FIG. 33 and FIG. 34 show a shielding effectiveness simulation for the semiconductor package structure in accordance with some embodiments of the subject application.

FIG. 33 shows a shielding effectiveness simulation for the semiconductor package structure 1k in accordance with some embodiments of the subject application. The curve C61 shows the shielding effectiveness simulation for the gap S1 being about 100 μm in the semiconductor package structure 1k. The curve C62 shows the shielding effectiveness simulation for the gap S1 being about 150 µm in the semiconductor package structure 1k. The curve C63 shows the shielding effectiveness simulation for the gap S1 being about 200 µm in the semiconductor package structure 1k. The curve C64 shows the shielding effectiveness simulation for the gap S1 being about 250 µm in the semiconductor package structure 1k. The curve C65 shows the shielding effectiveness simulation for the gap S1 being about 300 µm in the semiconductor package structure 1k. The curve C66 shows the shielding effectiveness simulation only for the ground pad and not for compartment shielding wirebond 15c. In the shielding effectiveness simulation, the shielding effectiveness may be larger than 20 dB for the gap S1 being about 100 µm at the frequencies below 4 GHz. Therefore, the shielding effectiveness for the small wire gap is better at low frequency.

Figure 34:
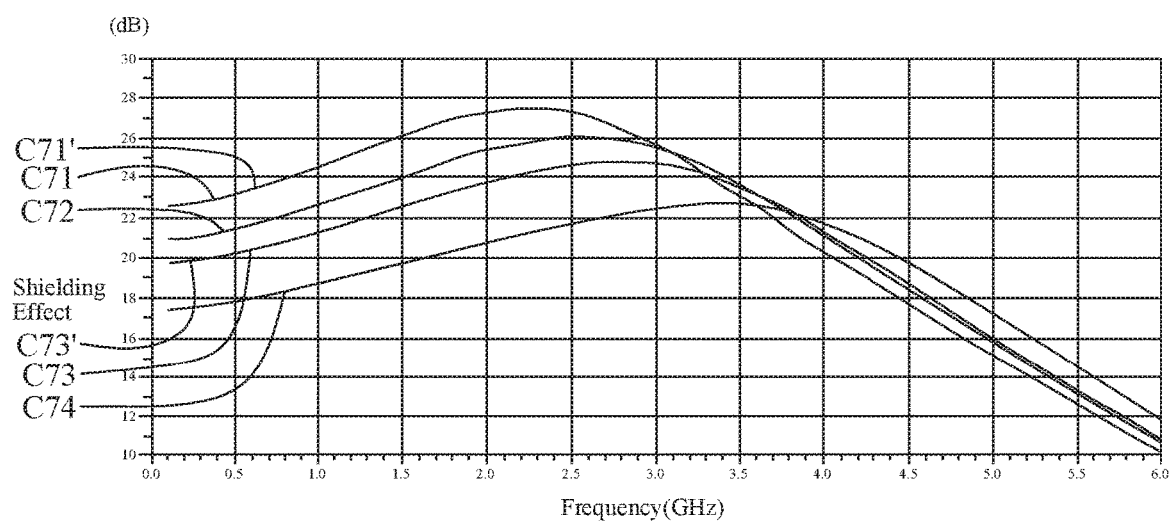

FIG. 34 shows a shielding effectiveness simulation for the semiconductor package structure 1k in accordance with some embodiments of the subject application. In the shielding effectiveness simulation, the height H1 of the compartment shielding wirebonds 15c may be about 300 µm, and the gap S1 of the compartment shielding wirebonds 15c may be about 100 µm. The curve C71 shows the shielding effectiveness simulation for the wire diameter of the compartment shielding wirebonds 15c-being about 33 µm—and for the Cu wire material in the semiconductor package structure 1k. The curve C71' shows the shielding effectiveness simulation for the wire diameter of the compartment shielding wirebonds 15c-being about 33 µm—and for the Au wire material in the semiconductor package structure 1k. The curve C72 shows the shielding effectiveness simulation for the wire diameter of the compartment shielding wirebonds 15c-being about 30 µm—and for the Cu wire material in the semiconductor package structure 1k. The curve C73 shows the shielding effectiveness simulation for the wire diameter of the compartment shielding wirebonds 15c-being about 25 µm—and for the Cu wire material in the semiconductor package structure 1k. The curve C73' shows the shielding effectiveness simulation for the wire diameter of the compartment shielding wirebonds 15c-being about 25 µm—and for the Au wire material in the semiconductor package structure 1k. The curve C74 shows the shielding effectiveness simulation for the wire diameter of the compartment shielding wirebonds 15c-being about 20 µm—and for the Cu wire material in the semiconductor package structure 1k. In the shielding effectiveness simulation, the shielding effectiveness for the large wire diameter is better at low frequency (e.g., <3.0 GHz). And there is no difference in shielding effectiveness between Cu wire material and Au wire material.

Figure 35:
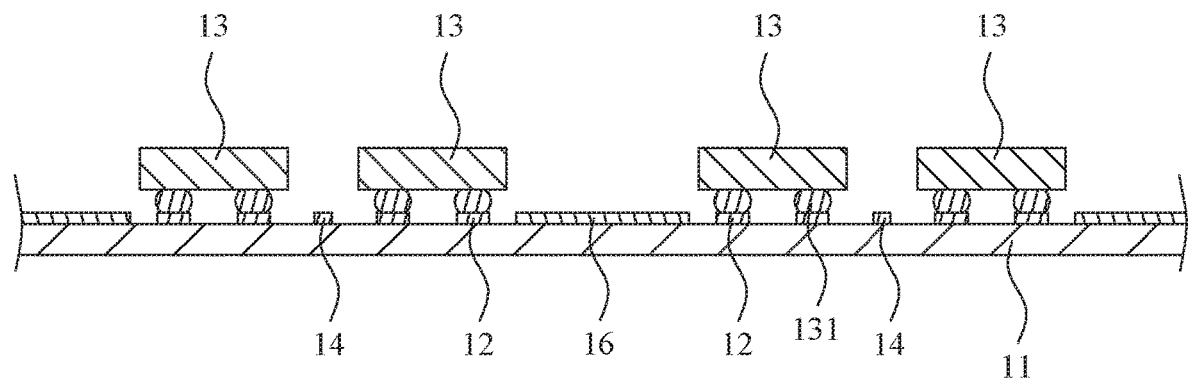
FIG. 35, FIG. 36, FIG. 37, FIG. 38, FIG. 39 and FIG. 40 illustrate various stages of a method for manufacturing a semiconductor package structure in accordance with some embodiments of the subject application.

FIGS. 35 to 40 illustrate a semiconductor manufacturing process according to some embodiments of the present disclosure. In some embodiments, the semiconductor manufacturing process is for manufacturing a semiconductor package structure such as the semiconductor package structure 1 shown in FIG. 1. Referring to FIG. 35, a substrate structure 11 is provided, and a plurality of signal pads 12, a plurality of shielding pads 14 and a protection structure 16 are formed or disposed on the substrate structure 11. Then, a plurality of electronic components 13 are disposed on the signal pads 12, and electrically connected to the signal pads 12. The electronic components 13 may be chips, chip scale package (CSP) or a passive element. The electronic components 13 include a plurality of conductive elements 131 for electrically connecting to the signal pads 12. The conductive elements 131 may be solder balls.

Figure 36:
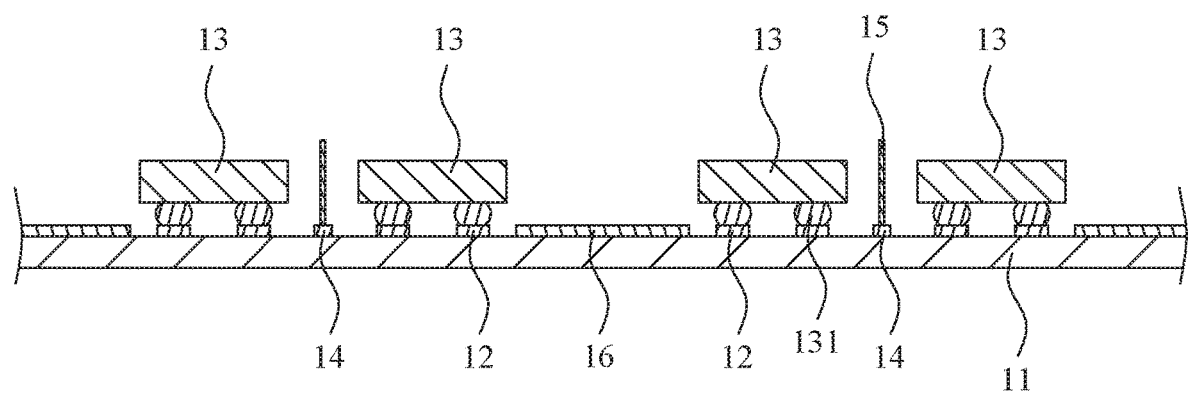

Referring to FIG. 36, a plurality of compartment shielding wirebonds 15 are mounted on the shielding pads 14, and electrically connected to the shielding pads 14. The compartment shielding wirebonds 15 are disposed between two adjacent electronic components 13, and used for providing internal shielding effect for the adjacent electronic components 13. The height of the compartment shielding wirebonds 15 may be higher than the height of the electronic components 13.

Figure 37:
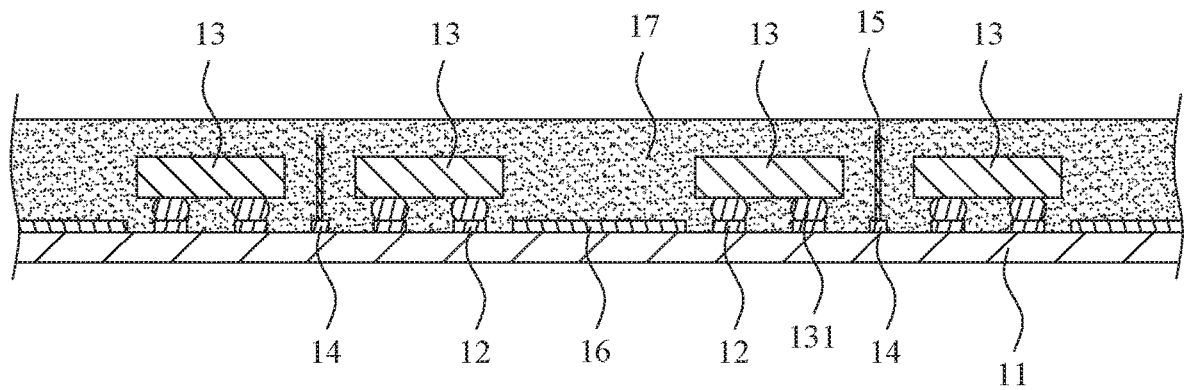

Referring to FIG. 37, an encapsulant 17 is formed to cover the electronic components 13 and the substrate structure 11. In some embodiments, the encapsulant 17 may be a molding compound. The encapsulant 17 covers the electronic components 13, the compartment shielding wirebonds 15, the first surface 111 of the substrate structure 11 and the protection structure 16.

Figure 38:
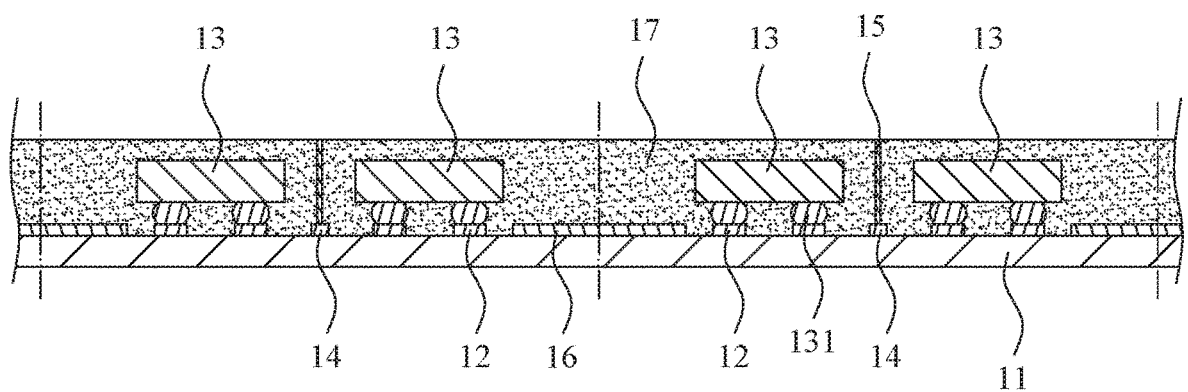

Referring to FIG. 38, the encapsulant 17 is ground to expose a portion of the compartment shielding wirebonds 15.

Figure 39:
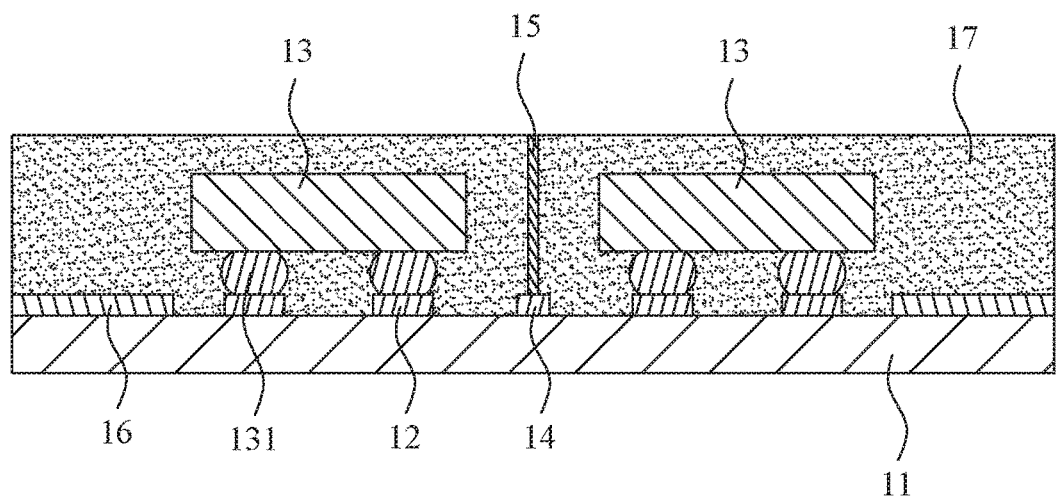

Referring to FIG. 39, a singulation process is conducted to form the semiconductor package structures.

Figure 40:
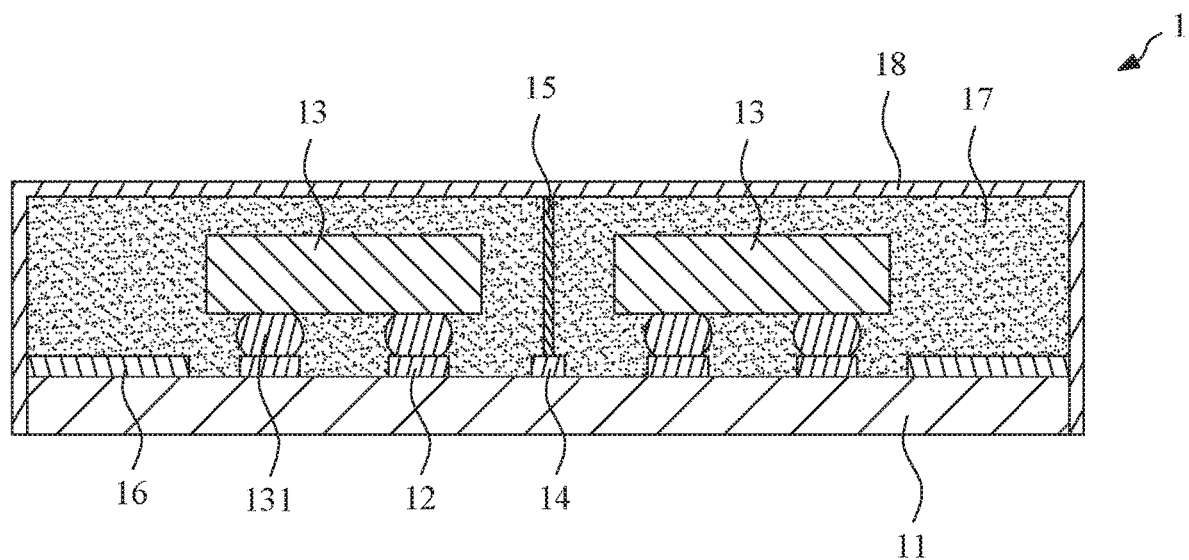

Referring to FIG. 40, a metal layer 18 is formed to cover the encapsulant 17. The metal layer 18 is used for providing an outside shielding effect for the electronic components 13. In some embodiments, the metal layer 18 may be electrically connected to the compartment shielding wirebonds 15.

Spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The terms "approximately," "substantially," "substantial" and "about" are used herein to describe and account for small variations. When used in conjunction with an event or circumstance, the terms can refer to instances in which the event or circumstance occurs precisely, as well as instances in which the event or circumstance occurs to a close approximation. As used herein with respect to a given value or range, the term "about" generally means within ±10%, ±5%, ±1%, or ±0.5% of the given value or range. Ranges can be expressed herein as being from one endpoint to another endpoint or between two endpoints. All ranges disclosed herein are inclusive of the endpoints, unless specified otherwise. The term "substantially coplanar" can refer to two surfaces within micrometers (µm) of lying along a same plane, such as within 10 within 5 within 1 or within 0.5 µm of lying along the same plane. When referring to numerical values or characteristics as "substantially" the same, the term can refer to the values lying within ±10%, ±5%, ±1%, or ±0.5% of an average of the values.

The foregoing outlines the features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor package structure, comprising:
   a substrate structure, having a first surface and a second surface opposite to the first surface;
   at least two electronic components, electrically connected to the first surface of the substrate structure;
   at least one shielding pad, disposed on the first surface of the substrate structure;
   a plurality of vias connected to the at least one shielding pad; and
   a plurality of shielding wirebonds disposed between the electronic components, wherein each of the shielding wirebonds includes a first bond and a second bond opposite to the first bond, the first bond and the second bond being electrically connected to the at least one shielding pad, and being free from overlapping with any of the plurality of vias,
   wherein the at least one shielding pad is a long pad, and a length of the at least one shielding pad may be greater than a length of the electronic devices.

2. The semiconductor package structure of claim 1, wherein a height of the shielding wirebonds is higher than that of the electronic components.

3. The semiconductor package structure of claim 1, wherein the substrate structure defines at least one slot surrounding the at least one shielding pad, the slot including a bottom surface, and the bottom surface is a rough surface.

4. The semiconductor package structure of claim 1, further comprising an underfill disposed between the electronic components and the substrate structure, wherein the underfill covers the shielding pad, and a portion of the shielding wirebonds.

5. The semiconductor package structure of claim 1, further comprising a solder covering the at least one shielding pad, wherein the compartment shielding wirebonds are mounted in the solder, the shielding wirebond has a ball structure embedded in the solder.

6. The semiconductor package structure of claim 1, further comprising an encapsulant covering the electronic components, the substrate structure, the at least one shielding pad and at least a portion of each of the shielding wirebonds.

7. The semiconductor package structure of claim 6, wherein a height of the shielding wirebonds is smaller than that of the encapsulant.

8. The semiconductor package structure of claim 6, further comprising a metal layer covering the encapsulant.

9. The semiconductor package structure of claim 1, wherein the at least one shielding pad is free from coverage of a solder resist layer.

10. The semiconductor package structure of claim 8, wherein the shielding wirebonds are electrically connected to the metal layer.

11. The semiconductor package structure of claim 1, further comprising at least one signal pad, disposing on the first surface of the substrate structure.

12. The semiconductor package structure of claim 11, wherein the electronic components are disposed on the at least one signal pad and electrically connect to the at least one signal pad.

13. The semiconductor package structure of claim 1, wherein the shielding wirebonds include a first compartment shielding wirebond row, disposed on the long pad of the shielding pad.

14. The semiconductor package structure of claim 1, wherein the substrate structure includes a wiring substrate.

15. The semiconductor package structure of claim 1, wherein each of the plurality of vias is arranged between the first bond and the second bond.

16. The semiconductor package structure of claim 1, wherein each of the plurality of vias is arranged between two adjacent shielding wirebonds of the plurality of shielding wirebonds.

17. The semiconductor package structure of claim 1, further comprising a spacing between the electronic components, wherein the spacing is about 200 μm to 400 μm.

18. The semiconductor package structure of claim 1, further comprising a gap between two adjacent shielding wirebonds of the plurality of shielding wirebonds is about 100 μm.

19. The semiconductor package structure of claim 1, the first bond is a ball bond, and the second bond is a wedge bond.

* * * * *